United States Patent
Sakamoto

(10) Patent No.: US 8,242,478 B2
(45) Date of Patent: Aug. 14, 2012

(54) SWITCHING DEVICE, SEMICONDUCTOR DEVICE, PROGRAMMABLE LOGIC INTEGRATED CIRCUIT, AND MEMORY DEVICE

(75) Inventor: Toshitsugu Sakamoto, Minato-ku (JP)

(73) Assignee: NEC Corporation, Tokyo (JP)

( * ) Notice: Subject to any disclaimer, the term of this patent is extended or adjusted under 35 U.S.C. 154(b) by 637 days.

(21) Appl. No.: 12/306,657

(22) PCT Filed: Jun. 25, 2007

(86) PCT No.: PCT/JP2007/062674
§ 371 (c)(1),
(2), (4) Date: Dec. 24, 2008

(87) PCT Pub. No.: WO2008/001712
PCT Pub. Date: Jan. 3, 2008

(65) Prior Publication Data
US 2009/0309088 A1 Dec. 17, 2009

(30) Foreign Application Priority Data
Jun. 26, 2006 (JP) ................................ 2006-175872

(51) Int. Cl.
*H01L 45/00* (2006.01)
(52) U.S. Cl. .................... 257/2; 257/774; 257/E45.002; 257/71; 257/200; 257/209; 438/95; 438/130; 438/259; 438/618
(58) Field of Classification Search ....... 257/2, E45.002, 257/4, 43, E29.002
See application file for complete search history.

(56) References Cited

U.S. PATENT DOCUMENTS

| | | | |
|---|---|---|---|
| 6,348,365 B1 | 2/2002 | Moore et al. | |
| 6,838,307 B2 | 1/2005 | Gilton | |
| 2005/0127524 A1* | 6/2005 | Sakamoto et al. | ............ 257/774 |

FOREIGN PATENT DOCUMENTS

| | | |
|---|---|---|
| JP | 2002-43418 A | 2/2002 |
| JP | 2002-536840 A | 10/2002 |
| WO | 00/48196 A1 | 8/2000 |
| WO | 03/094227 A1 | 11/2003 |
| WO | 2005/008783 A1 | 1/2005 |

OTHER PUBLICATIONS

Shunichi Kaeriyama, et al, "A Nonvolatile Programmable Solid-Electrolyte Nanometer Switch", IEEE Journal of Solid-State Circuits, Jan. 2005, p. 168-176, vol. 40, No. 1.

* cited by examiner

*Primary Examiner* — Mamadou Diallo
(74) *Attorney, Agent, or Firm* — Sughrue Mion, PLLC

(57) ABSTRACT

A typical switching device according to the present invention comprises first insulating layer 1003 having an opening and made of a material for preventing metal ions from being diffused, first electrode 104 disposed in the opening and including a material capable of supplying the metal ions, ion conduction layer 105 disposed in contact with an upper surface of the first electrode 104 and capable of conducting the metal ions, and second electrode 106 disposed in contact with an upper surface of the ion conduction layer 105 and including a region made of a material incapable of the metal ions. A voltage is applied between the first electrode 104 and the second electrode 106 for controlling a conduction state between the first electrode 104 and the second electrode 106.

23 Claims, 13 Drawing Sheets

SWITCHING DEVICE, SEMICONDUCTOR DEVICE, PROGRAMMABLE LOGIC INTEGRATED CIRCUIT, AND MEMORY DEVICE

TECHNICAL FIELD

The present invention relates to a switching device employing an ion conductor, a method of manufacturing same, a semiconductor device, a programmable logic integrated circuit, and a memory device which employ such a switching device.

BACKGROUND ART

At present, electronic devices have many integrated circuits in use. The many integrated circuits used in the electronic devices are so-called application-specific integrated circuits (ASIC) that are dedicated circuits designed for use in those electronic devices. After an application-specific integrated circuit has been manufactured, its circuit configurations cannot be changed because logic cells (logic circuits serving as units, such as AND circuits and OR circuits) are laid out and interconnected in the integrated circuit fabrication process.

Recent years have seen intensive electronic device development races and electronic device miniaturization. Under the circumstances, attention has been directed to programmable logic devices (rewritable logic integrated circuits) which are capable of selecting certain functions from many functions on one chip by changing circuit configurations with electric signals even after the programmable logic devices have been manufactured.

A programmable logic device comprises a plurality of logic cells interconnected through switches. Typical examples of programmable logic devices include an FPGA (Field-Programmable Gate array) and a DRP (Dynamically Reconfigurable Processor).

Although programmable logic devices are attracting attention, they have been installed in electronic devices in limited applications thus far. The reasons for their limited use will be described below. In programmable logic devices available up to now, the switches which interconnect logic cells are large in size and high in on-resistance. In order to restrict the installed number of such switches as much as possible, it has been customary to employ a small number of logic cells each comprising many transistors. As a result, the logic cells can be used in limited combinations, resulting in limited functions that the programmable logic device can provide. In other words, the large size and high on-resistance of the switches that are used in the programmable logic devices available up to now have limited the functions of the programmable logic devices and also have limited their installation into electronic devices.

For giving programmable logic devices increased multiple functionality and promoting their installation into electronic devices, it is necessary to reduce the size and on-resistance of switches interconnecting logic cells in the programmable logic devices.

As a switch device which meets the above requirements, a switching device based on the metal ion movement and electrochemical reaction in an ion conductor (a solid substance in which ions can move freely) is disclosed in "Journal of Solid-State Circuits", Vol. 40, No. 1, pages 168 through 176, 2005 (hereinafter referred to as "Document 1").

The switching device based on the metal ion movement and electrochemical reaction in an ion conduction layer as disclosed in Document 1 comprises three layers including an ion conduction layer and first and second electrodes which are disposed on opposite surfaces held in contact with the ion conduction layer. The first electrode serves to supply metal ions to the ion conduction layer. The second electrode does not supply metal ions.

Operation of the switching device will briefly be described below. When the first electrode is connected to ground and a negative voltage is applied to the second electrode, metal ions from the metal of the first electrode are dissolved into the ion conduction layer. The metal ions in the ion conduction layer are precipitated as metal in the ion conduction layer, forming a metal bridge which connects the first electrode and the second electrode to each other. When the first electrode and the second electrode are electrically connected to each other by the metal bridge, the switch is turned on.

When the first electrode is connected to ground and a positive voltage is applied to the second electrode while the switch is on, a portion of the metal bridge is cut off. The first electrode and the second electrode are now electrically disconnected from each other, turning off the switch. Specifically, before the first electrode and the second electrode are fully disconnected from each other, the resistance between the first electrode and the second electrode increases and the capacitance therebetween changes, i.e., the electric characteristics of the switch change. After the electric characteristics of the switch have changed, the first electrode and the second electrode are finally disconnected from each other. To turn on the switch that has been turned off, a negative voltage may be applied again to the first electrode.

Document 1 reveals the structure and operation of the two-terminal switch for controlling the conduction between the two electrodes with the ion conductor interposed between. "WO2005/008783 publication" (hereinafter referred to as "Document 2") proposes a three-terminal ion conductor switching device which additionally includes a control electrode (third electrode) for controlling the conduction between the first and second electrodes based on a voltage applied to the control electrode.

Switching devices including an ion conductor are considered to be promising for use in programmable logic devices because they are smaller in size and lower in on-resistance than semiconductor switches (MOSFETs or the like) that have generally been used. Such a switch is also applicable as a nonvolatile memory device because its conduction state (on or off remains unchanged even when the applied voltage is turned off. For example, a nonvolatile memory is constructed of a plurality of memory cells, each comprising a selective device such as a transistor and a switching device including an ion conductor, which are arrayed in a matrix of vertical columns and horizontal rows. Any desired one of the memory cells is selected by signals supplied to word lines and bit lines. The conduction state of the switching device of the selected memory cells is sensed to read information of either "1" or "0" based on whether the switching device is turned or off (see Document 1).

Methods of manufacturing such a switching device in an integrated circuit are disclosed in U.S. Pat. No. 6,348,365 (hereinafter referred to as "Document 3") and U.S. Pat. No. 6,838,307 (hereinafter referred to as "Document 4").

FIG. 1 is a cross-sectional view showing the structure of the switching device disclosed in Document 3. According to the device structure disclosed in Document 3, as shown in FIG. 1, a stacked-layer structure comprising a metal layer (indicated as "metal material 41") and an ion conductor (indicated as "ion conduction layer 51") is embedded in an opening in an insulating layer (indicated as "insulating material 13"). The ion conduction layer is made of chalcogenide in the form of a germanium and selenium layer including silver. The structure is fabricated as follows: After the ion conduction layer is embedded in the opening, a recessed structure is formed. The metal layer is embedded in the recessed structure and diffused by the application of light, thereby producing the desired stacked-layer structure. As shown in FIG. 1, the metal layer for supplying metal ions is held in contact with the insulating layer. The insulating layer with the opening is disposed on conductive material 12 disposed on insulating material 11 which is disposed on semiconductor substrate 10.

FIG. 2 is a cross-sectional view showing the structure of the switching device disclosed in Document 4. According to the device structure disclosed in Document 4, upper electrode 133 is partly embedded in an opening in insulating layer 121, and ion conduction layer 107 (referred to as "cell body" in Document 4) is embedded beneath upper electrode 133. Spacer 131 is held against the side wall of the opening in insulating layer 121. Therefore, the upper surface of ion conduction layer 107 is partly held in contact with upper electrode 133. When metal ions are supplied from upper electrode 133 to ion conductor 107, spacer 131 serves to prevent the metal ions from entering the boundary between insulating layer 121 and ion conductor 107. As a result, the metal ions are uniformly supplied to ion conductor 107.

DISCLOSURE OF THE INVENTION

In order for the switch based on the ion conduction to operate, the switch is based on the assumption that the electrode for supplying metal ions and the ion conductor are held in contact with each other and the metal ions are dissolved into the ion conductor and conducted therein. However, since the above process is accompanied by the movement of ions, the ions may leak out of the switch, causing a metal contamination, unless properly controlled when the switch performs its switching operation. For example, if a switching device based on the ion conduction is provided in the multilayer interconnection structure of a semiconductor device, then when metal ions leak out of the switching device, the metal ions are diffused into interlayer insulating films, tending to deteriorate interconnections and insulation between vias and shorten the service life of the interconnections.

It is a typical object of the present invention to provide a switching device which prevents metal ions from leaking from an electrode for increased reliability, a semiconductor device, a programmable logic integrated circuit, and a memory device which employ such a switching device.

A typical switching device according to the present invention comprises a first insulating layer having an opening and made of a material for preventing metal ions from being diffused, a first electrode disposed in the opening and including a material capable of supplying the metal ions, an ion conduction layer disposed in contact with an upper surface of the first electrode and capable of conducting the metal ions, and a second electrode disposed in contact with an upper surface of the ion conduction layer and including a region made of a material incapable of the metal ions, wherein a voltage is applied between the first electrode and the second electrode for controlling a conduction state between the first electrode and the second electrode.

According to the present invention, since the first electrode for supplying the metal ions is embedded in the opening in the insulating layer having a diffusion prevention function, metal is prevented from being diffused and leaking from side surfaces of the electrode. Therefore, the switching device is effectively prevented from being contaminated by metal. As a result, the switching device is more effective to prevent metal ions from being diffused and leaking out than related devices. Consequently, the switching device according to the present invention and a semiconductor device which employs the switching device are high in reliability and can be used stably over a long period of time.

DESCRIPTION OF REFERENCE CHARACTERS

Figure 1:
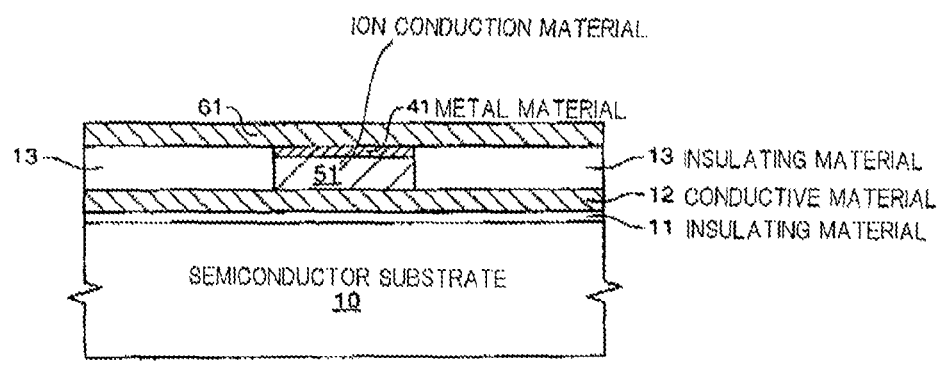
FIG. 1 is a cross-sectional view showing the structure of a related switching device.
Figure 2:
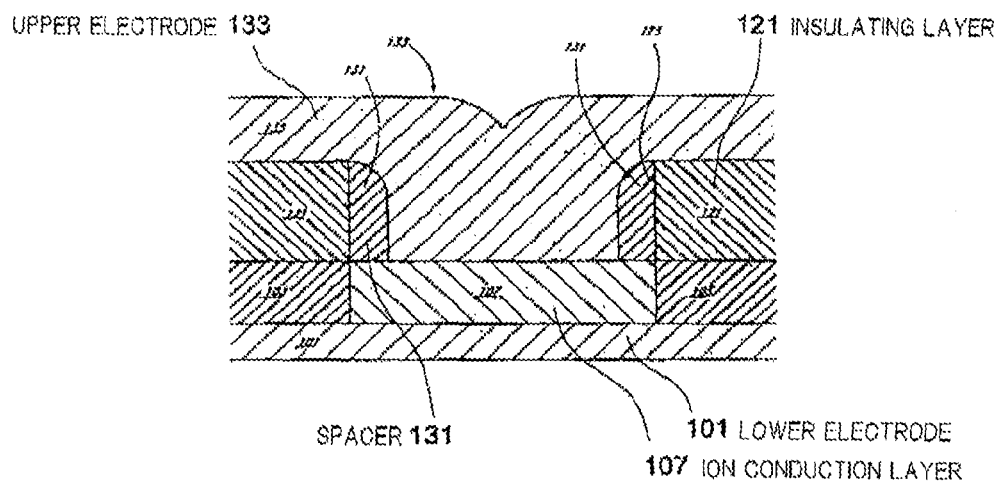
FIG. 2 is a cross-sectional view showing the structure of another related switching device.

1003 first insulating layer
1030 diffusion prevention layer
104 first electrode
105 ion conduction layer
106 second electrode
113 second diffusion prevention layer
305 third electrode

BEST MODE FOR CARRYING OUT THE INVENTION (First Exemplary Embodiment)

Figure 3:
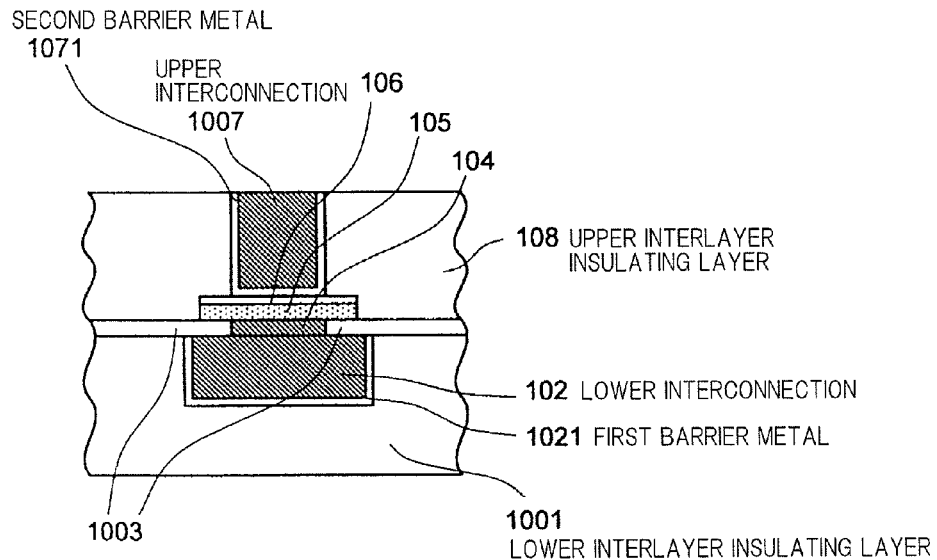
FIG. 3 is a cross-sectional view showing a configurational example of a switching device according to a first exemplary embodiment.

The configuration of a switching device according to the present exemplary embodiment will be described below. The switching device according to the present exemplary embodiment comprises a two-terminal switch. FIG. 3 is a cross-sectional view showing a configurational example of the switching device according to the present exemplary embodiment. As shown in FIG. 3, the switching device comprises first insulating layer 1003 having an opening, first electrode 104 embedded in the opening, ion conduction layer 105 disposed in contact with the upper surface of first electrode 104, and second electrode 106 disposed in contact with the upper surface of ion conduction layer 105. In FIG. 3, first electrode 104, ion conduction layer 105, and second electrode 106 are stacked on a base body. The ion conduction layer is also referred to as an ion conductor or a solid-state electrolytic layer. The term "ion conduction layer" or "ion conductor" will be used below.

First electrode 104 is capable of supplying metal ions to ion conduction layer 105. Specifically, first electrode 104 is made of a material whose composition is capable of supplying metal ions based on an electrochemical reaction. First insulating layer 1003 is made of a material capable of preventing metal ions supplied from the first electrode from being diffused. First insulating layer 1003 is also referred to as a first diffusion prevention layer. Second electrode 106 does not supply metal ions. Specifically, at least a portion of second electrode 106 which is close to the surface of ion conduction layer 105 has a composition that is incapable of supplying metal ions to ion conduction layer 105.

Operation of the switching device according to the present exemplary embodiment will be described below. Since operation of the switching device according to the present exemplary embodiment is basically the same as the operation of the two-terminal switching device disclosed in Document 1, it will briefly be described below.

Positive and negative voltages are applied between the first electrode and the second electrode to control the conduction state between the electrodes thereby to turn on and off the switch. First, switching from the turn-off to the turn-on of the switch will be described below. When a voltage which is negative with respect to first electrode 104 having an ion supply function is applied to second electrode 106, metal ions from the metal of first electrode 104 are dissolved into the ion conduction layer. The metal ions in ion conduction layer 105 are precipitated as metal in the ion conduction layer, forming a metal bridge which connects first electrode 104 and second electrode 106 to each other. When first electrode 104 and second electrode 106 are electrically connected to each other by the metal bridge, the switch is turned on.

Switching from the turn-on to the turn-off of the switch will be described below. While the switch is on, a voltage which is positive with respect to first electrode 104, i.e., a voltage which is reverse to the voltage applied to switch from the turn-off to the turn-on, is applied to second electrode 106, cutting off a portion of the metal bridge. First electrode 104 and second electrode 106 are electrically disconnected from each other, turning off the switch. Rather than using the complete cutoff or short circuit of the electric connection, a change in electric characteristics, such as a change in the electric resistance between the first electrode and the second electrode or a change in the interelectrode capacitance, may be sensed for use as a switch or a storage action. According to the present invention, changes in the conduction state including these changes in electric characteristics will be referred to as switching operation.

With the basic configuration of the switching device according to the present exemplary embodiment, since the first electrode having the metal ion supply function is embedded in the first insulating layer having the diffusion prevention function, metal ions are prevented from being diffused or leaking from the side surfaces of the first electrode into the surrounding structure.

As the first electrode is embedded in the opening, the path of a current flowing in the ion conductor is limited in a planar fashion. This simultaneously limits the path of metal ions that are dissolved into the ion conductor. Accordingly, the metal ions that are dissolved into the ion conductor are effectively prevented from spreading in the ion conduction layer and leaking out of the ion conduction layer. The switching device according to the present invention is thus capable of preventing metal ions from affecting and contaminating the surrounding structure, is highly reliable, and achieve a high production yield.

Base bodies on which the switching device according to the present exemplary embodiment can be formed when the switching device is fabricated will be described below.

The switching device according to the present exemplary embodiment can be formed on various base bodies. A semiconductor substrate with active elements formed thereon that are required for the functions of the switching device may be used as a base body. A semiconductor substrate with its surface covered with an insulating film may also be used as a base body. In this case, active elements formed on the surface of the semiconductor substrate may be covered with the insulating film. Furthermore, a semiconductor substrate with a multilayer interconnection structure formed thereon that comprises interlayer insulating films and interconnections may be used as a base body.

Particularly, if the switching device according to the present exemplary embodiment is used as a switch in a programmable logic circuit, then a structure including a semiconductor substrate with multilayer interconnections formed thereon should preferably be used as a base body. The switching device according to the present invention is not limited to being formed on a base body having multilayer interconnections. The switching device may be formed on a base body having multilayer interconnections and covered with an interlayer insulating film, with interconnections being formed as an upper layer over the interlayer insulating film. This structure can be formed by embedding the switching device according to the present invention in the multi-layer interconnection structure of a semiconductor device.

In the structure shown in FIG. 3, lower interlayer insulating layer 1001 that is disposed on a semiconductor substrate (not shown) is used as a base body. Though not shown, elements and interconnections may be disposed between the semiconductor substrate and lower interlayer insulating layer 1001.

Installation of the switching device according to the present exemplary embodiment in a semiconductor device will be described below. If the switching device is to be installed in an interlayer insulating film of a semi-conductor device having a multilayer interconnection structure, then the following configurational details should desirably be employed:

As shown in FIG. 3, since the opening in first insulating layer 1003 comprises a through hole, first electrode 104 has its lower surface held in contact with the base body. As the switching device utilizes a phenomenon wherein a current flows and metal ions are dissolved, contaminations caused by the contact between the lower surface of first electrode 104 and other regions are not significantly detrimental to the switching device per se. However, it may not be preferable for metal ions to be brought into direct contact with the interlayer insulating film and the semiconductor substrate because metal leaking into the interlayer insulating film and the semiconductor substrate tends to degrade the insulation. In FIG. 3, the base body with the switching device mounted thereon includes lower interconnection 102 disposed in contact with the lower surface of first electrode 104 to keep first electrode 104 out of direct contact with lower interlayer insulating layer 1001 which serves as an insulating film of the base body.

Lower interconnection 102 should preferably have a width, which corresponds to the horizontal (lateral) length in FIG. 3, large enough to cover the entire lower surface of first electrode 104 for more effectively preventing metal ions from being diffused from the lower surface of first electrode 104. Furthermore, in view of the registration accuracy in a lithographic process for forming the opening in first insulating layer 1003 above lower interconnection 102, the widthwise dimension of lower interconnection 102 should desirably be excessively larger than the entire lower surface of first electrode 104, as shown in FIG. 3. Lower interconnection 102 disposed in contact with the lower surface of first electrode 104 can double as an electric connection between first electrode 104 and an external circuit.

The material of lower interconnection 102 will be described below. The material of lower interconnection 102 is not limited to any particular materials, but should desirably be a conductive material normally used in semiconductor devices. For example, the conductive material may be any one of copper and aluminum widely used as primary materials of multilayer interconnections in LSI circuits and metals of high melting point such as W (tungsten) used as materials to be embedded in vias in multilayer interconnections. Furthermore, the conductive material may be an alloy containing some of the above metals or a nitride or silicide containing at least one of the above metals. If lower interconnection 102 is made of a conductive material which primarily contains copper, then it is desirable to provide first barrier metal film 1021 around lower and side surfaces of lower interconnection 102 as well known in the process of forming copper interconnections.

With the widthwise dimension of lower interconnection 102 being thus determined and also with the barrier film being provided depending on the material of lower interconnection 102, metal ions are also prevented from leaking from first electrode 104 of the switching device.

The pattern and shape of ion conduction layer 105 will be described below. Ion conduction layer 105 covers at least a portion of first electrode 104. Preferably, ion conduction layer 105 should cover the entire upper surface of first electrode 104. Furthermore, ion conduction layer 105 should more desirably have its pattern extending over and reaching the upper surface of first insulating layer 1003. The increased pattern of ion conduction layer 105 limits the current path, referred to above, more effectively preventing the leakage of ions.

The pattern of ion conduction layer 105 which extends over and reaches the upper surface of first insulating layer 1003 as shown in FIG. 3 is effective to minimize the leakage of metal out of the switching device when metal ions are supplied and absorbed between first electrode 104 and second electrode 106 to turn on and off the switch. At the same time, it also is effective to increase the reliability of the switching device for a long period of time.

The shape of ion conduction layer 105 is typically a planar shape as shown in FIG. 3. Ion conduction layer 105 of planar shape is advantageous in controlling the distance between first electrode 104 and second electrode 106 for better controllability of switching voltages. Alternatively, ion conduction layer 105 may be of a three-dimensionally curved shape or the interface between first electrode 104 and second electrode 106 may include convexities and concavities to positively change the minimum distance between first electrode 104 and second electrode 106. For example, the minimum distance between first electrode 104 and second electrode 106 may be reduced to enable the switching device to perform switching operation under a low voltage.

The relationship between the patterns of ion conduction layer 105 and second electrode 106 will be described below. Second electrode 106 disposed on ion conduction layer 105 has an area overlapping first electrode 104, on the upper surface of ion conduction layer 105. Second electrode 106 should desirably be disposed in covering relation to a position confronting first electrode 104. Furthermore, second electrode 106 should desirably cover the entire upper surface of ion conduction layer 105. With this arrangement, metal ions dissolved from first electrode 104 into ion conduction layer 105 are precipitated only below second electrode 106, and are effectively prevented from leaking out.

If second electrode 106 is formed in covering relation to the entire upper surface of ion conduction layer 105, then they may be processed using the same mask pattern in the lithographic process. Therefore, second electrode 106 and ion conduction layer 105 can effectively be registered with each other, with the result that the manufacturing process is simplified. Second electrode 106 may cover the upper surface and also side surfaces of ion conduction layer 105. Such an arrangement is effective to prevent ions from leaking from the side surfaces of ion conduction layer 105.

Other advantages of the configuration shown in FIG. 3 will be described below. According to a configurational example in which second electrode 106 is connected to an external circuit, second electrode 106 and the external circuit are connected to each other by a via plug (indicated as upper interconnection 1007 in FIG. 3) directly above the switching device. Such a connection is referred to as a via connection. This configuration is advantageous for miniaturization and integration because the area taken up by the switching device is minimized.

With the via connection directly above the switching device, the conductor of the via plug (a lowermost layer if the via plug is of a stacked-layer structure) may double as second electrode 106. According to another configuration in which second electrode 106 is connected to an external circuit, second electrode 106 may be extended out of the switching device, and a via connection may be made to the upper or lower surface of the extension. Second electrode 106 itself may double as an interconnection to the external circuit.

Ion conductor 105 and second electrode 106 may have peripheral sides covered with another diffusion prevention layer to prevent metal ions from leaking out.

The switching device according to the present invention may be covered with an insulating layer in its entirety. In the multilayer structure of a semiconductor device, the insulating layer may be in the form of an interlayer insulating film, and an interconnection to the second electrode may be disposed in the interlayer insulating film.

The preferred materials of major components of the switching device will be described below.

The material of ion conduction layer 105 should preferably be a compound of metal or semiconductor and a chalcogen element such as oxygen, sulfur, selenium, tellurium, or the like. Particularly, a sulfide, an oxide, or an oxysulfide having an arbitrary sulfur-oxygen ratio, which contains at least one of the metals of copper, tungsten, tantalum, molybdenum, chromium, titanium, and cobalt in the periodic table of elements is preferable. If the switching device is to be installed in a semiconductor device, then a metal oxide, particularly tantalum oxide ($Ta_2O_5$) or titanium oxide ($TiO_2$), is preferable for the following reasons: First, since the metal oxide is a material that is generally used in semiconductor devices, it has a high process matching capability. Secondly, if the switching device is to be used in a programmable logic device, then the metal oxide used as the ion conduction layer makes it possible to have a higher switching voltage than a logic voltage. The metal oxide is also highly resistant to repetitive operation and is highly reliable.

The film thickness of ion conduction layer 105 can be set to a value in the range from about 5 to 200 nm. Particularly, the film thickness of ion conduction layer 105 should preferably be in the range from 10 to 100 nm. If the film thickness is equal to or smaller than 10 nm, then it may tend to cause a leakage current due to a tunnel current and a Schottky current when the switching device is turned off. If the film thickness is equal to or greater than 100 nm, then the switching voltage becomes 10 V or higher, making the switching device practically infeasible. Though ion conduction layer 105 is typically in the form of a single-layer film, it may be of a stacked-layer structure comprising two or more films having different ion conduction characteristics or electric characteristics. The stacked-layer structure makes it possible to control the switching voltage (threshold voltage) and leakage characteristics at the time the switching device is turned off.

First electrode 104 is made of a metal or an alloy containing a primary material of at least one of Cu, Ag, and Pb for supplying ions into ion conduction layer 105. Particularly, in view of the semiconductor process matching capability, the primary material should desirably be Cu. These metals or alloys may be present in a portion of at least the surface of the first electrode which is held in contact with ion conduction layer 105. Consequently, first electrode 104 may be of a stacked-layer structure including a layer of Cu held in contact with ion conduction layer 105, as well as a single-layer film as shown in FIG. 3. The surface of the first electrode which is held in contact with ion conduction layer 105 may be a composite of a metal such as Cu capable of supplying ions and a metal incapable of supplying ions.

Second electrode 106 is made of a conductor which is not liable to receive metal ions from ion conduction layer 105. Specifically, second electrode 106 should preferably be made of a metal of high melting point such as platinum, aluminum, gold, titanium, tungsten, vanadium, niobium, tantalum chromium, or molybdenum, a nitride of at least either one of these metals, a silicide of at least either one of these metals, or an alloy of plural ones of these metals. At least the surface of second electrode 106 which is held in contact with ion conduction layer 105 may be made of the above material. Therefore, second electrode 106 may be of a stacked-layer structure including a layer of the above material held in contact with ion conduction layer 105, as well as a single-layer film as shown in FIG. 3.

First insulating layer 1003 is made of a material which is capable of preventing a metal species which can be dissolved and precipitated from being diffused into the ion conduction layer when the switching device is in operation. For example, if first electrode 104 is made of Cu, then first insulating layer 1003 should preferably be in the form of an insulating film containing nitrogen, particularly a silicon nitride film or a silicon oxynitride film, or be made of a nitrogen-containing film material containing an arbitrary amount of carbon (silicon carbonitride). Depending on the material, first insulating layer 1003 may have a thickness of 2 nm or higher to provide the diffusion prevention function. The thickness of 5 nm or higher is sufficient enough.

The "insulating film containing nitrogen" referred to above often has a relatively high dielectric constant, and hence should preferably be as thin as possible insofar as it can provide the diffusion prevention function. Specifically, it is desirable for the thickness of the insulating film to have an upper limit of 200 nm or less. If the side surfaces of ion conduction layer 105 and the upper surface or side surfaces of second electrode 106 are covered with a diffusion prevention insulating layer, then the diffusion prevention insulating layer may be made of the same material as first insulating layer 1003.

If the switching device according to the present invention is provided in an interlayer insulating film, then the interlayer insulating film and interconnections may be made of materials selected from the materials that are generally used in semiconductor devices. For example, the material of the interconnections should preferably be copper or an alloy containing copper as a primary material, which can be used with a barrier metal such as Ta or TaN surrounding the interconnections. The interlayer insulating film may be made of any one of insulating materials used in the semiconductor process, such as silicon oxide or an organic or inorganic insulating material of low dielectric constant.

As described above, the present invention provides a switching device which prevents metal ions from being diffused and leaking out of the switching device and has excellent long-term reliability. The switching device according to the present invention can be manufactured easily with a high yield.

As the switching device according to the present invention has the first electrode, which serves as an ion supply source, as a lower electrode, it is further advantageous in that if the switching device is installed in a semiconductor device with the first electrode being made of Cu, then the first electrode is capable of providing a highly pure ion supply source. In the switching device whose operating principles are based on the movement of metal ions in the ion conduction layer, the electrode which performs the ion supply function should desirably be made, as purely as possible, of a metal species for supplying ions.

Cu which is used as a primary material of interconnections and a material of electrodes in semiconductor devices is produced by an electrolytic plating process. In the electrolytic plating process, a copper seed layer is employed for supplying a uniform current required for plating or increasing adhesion to the barrier metal. The seed layer contains a trace of metal impurity such as aluminum or the like for increased electromigration resistance. Since the Cu film thus produced contains a metal impurity such as aluminum in its lower surface and a highly concentrated impurity in an initially grown film (near the lower surface), it is difficult to manufacture a switching device wherein a Cu electrode is used as an upper electrode. According to the present invention, Cu which performs the ion supply function can be used as the material of the lower electrode (first electrode) beneath the ion conduction layer. Consequently, the problem of the existence of a barrier metal is avoided. Since the upper layer portion of the Cu film is used as an ion supply source, it can easily be highly purified. Therefore, the highly pure ion supply source can be realized.

EXAMPLE 1

Figure 4:
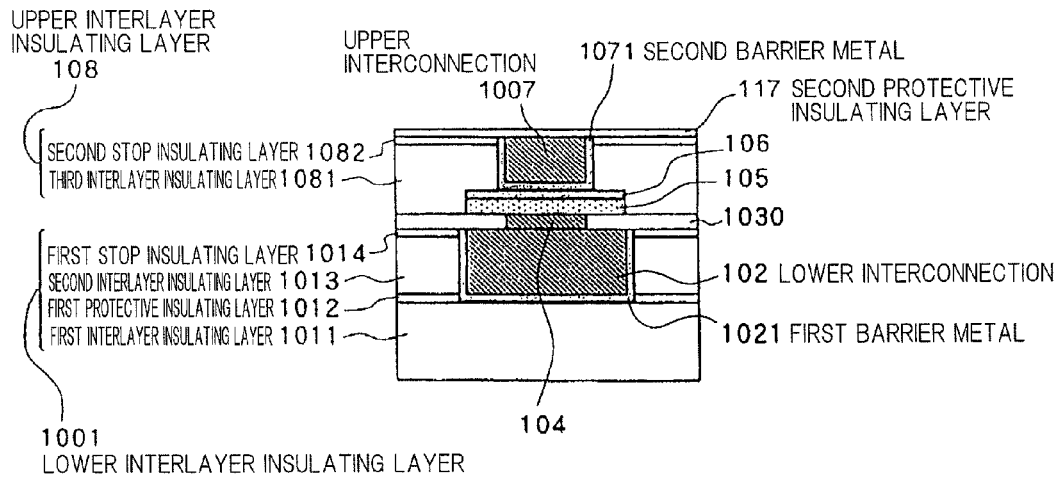
FIG. 4 is a cross-sectional view showing the configuration of a switching device according to a first example.

The present example represents a configurational example of the switching device according to the first exemplary embodiment. FIG. 4 is a cross-sectional view showing the configuration of a switching device according to the first example.

As shown in FIG. 4, the switching device is basically the same structure as the structure shown in FIG. 3. The switching device includes, on a base body for providing a multilayer interconnection structure, first electrode 104 embedded in an opening in diffusion prevention layer 1030 which corresponds to first insulating layer 1003 shown in FIG. 3, ion conduction layer 105 disposed in contact with the upper surface of first electrode 104, and second electrode 106 covering the upper surface of ion conduction layer 105. The opening in diffusion prevention layer 1030 comprises a through hole as with the structure shown in FIG. 3.

The base body on which the switching device is disposed comprises a silicon substrate (not shown), semiconductor elements, not shown, disposed on the silicon substrate, and an insulating film covering the semiconductor elements. Lower interlayer insulating layer 1001 is disposed on the insulating film. Lower interlayer insulating layer 1001 has an interconnection groove housing therein lower interconnection 102 which is held in contact with the lower surface of first electrode 104. Upper interconnection 1007 is disposed above second electrode 106 with second barrier metal film 1071 interposed therebetween. Upper interlayer insulating layer 108 is disposed on diffusion prevention layer 1030. Upper interlayer insulating layer 108 covers exposed surfaces of ion conduction layer 105 and second electrode 106 and side surfaces of second barrier metal film 1071 disposed on the bottom and side surfaces of upper interconnection 1007.

In FIG. 4, lower interlayer insulating layer 1001 is of a stacked-layer structure comprising a succession of first interlayer insulating layer 1011, first protective insulating layer 1012, second interlayer insulating layer 1013, and first stop insulating layer 1014 in view of a matching capability for the process of forming interconnections in the multilayer interconnection structure. First barrier metal film 1021 are disposed around the lower and side surfaces of lower interconnection 102 which is disposed in the interconnection groove in lower interlayer insulating layer 1001. Upper interlayer insulating layer 108 is of a stacked-layer structure comprising a succession of third interlayer insulating layer 1081 and second stop insulating layer 1082. Second protective insulating layer 117 is disposed on second stop insulating layer. Second barrier metal film 1071 is disposed on the lower and side surfaces of upper interconnection 1007 which is disposed in a via defined in upper interlayer insulating layer 108.

Figure 5A:
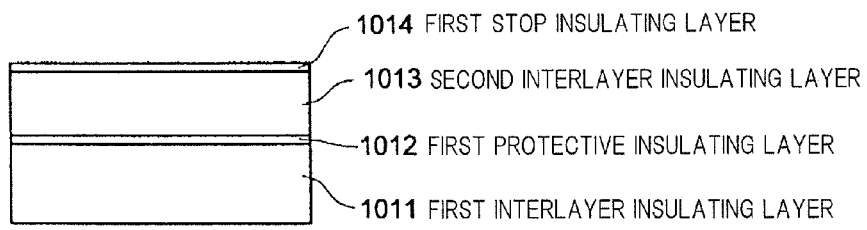
FIG. 5A is a cross-sectional view showing a method of manufacturing the switching device according to the first example.
Figure 5B:
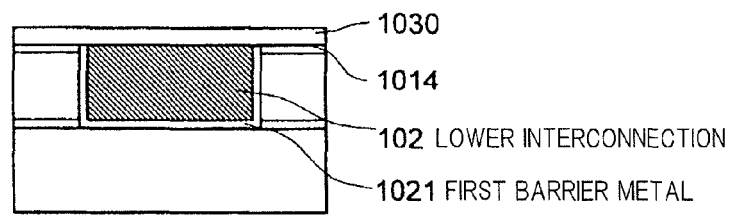
FIG. 5B is a cross-sectional view showing the method of manufacturing the switching device according to the first example.
Figure 5C:
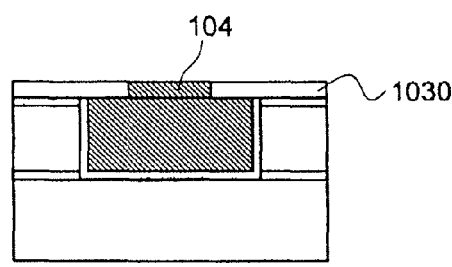
FIG. 5C is a cross-sectional view showing the method of manufacturing the switching device according to the first example.

A method of manufacturing the switching device according to the present example will be described below. FIGS. 5A through 5F are cross-sectional views showing a method of manufacturing the switching device according to the present example. FIGS. 5A through 5C correspond respectively to [Step A] through [Step C], and FIGS. 5D through 5F correspond respectively to [Step D] through [Step F].

[Step A] A base body including semiconductor elements produced by the technology which is generally known is prepared on a silicon substrate (not shown). Thereafter, first interlayer insulating layer 1011, first protective insulating layer 1012, second interlayer insulating layer 1013, and first stop insulating layer 1014 are successively formed. First interlayer insulating layer 1011 comprises a silicon nitride film and is formed by the CVD (chemical vapor deposition) process.

[Step B] Using the photolithographic technology and the etching technology, an opening for forming an interconnection therein is formed in first protective insulating layer 1012, second interlayer insulating layer 1013, and first stop insulating layer 1014. First barrier metal film 1021 and a copper seed layer (not shown) are deposited in the formed opening by the CVD process. The copper seed layer is deposited to a thickness in the range from about 20 to 100 nm and contains a small amount of impurity (e.g., aluminum). The copper seed layer is electrolytically plated with a copper film having a thickness in the range from about 800 to 1200 nm. Then, unwanted first barrier metal and copper deposits on first stop insulating layer 1014 except the opening therein are scraped off by CMP (chemical mechanical polishing), thereby forming lower interconnection 102. Furthermore, the assembly is heat-treated to diffuse the impurity into lower interconnection 102 in its entirety. The heat treatment increases the electromigration resistance of lower interconnection 102. The process of forming lower interconnection 102 is widely used as a process of forming interconnections in a semiconductor device. Thereafter, a film of silicon carbonitride (a material of silicon nitride containing carbon) which will serve as diffusion prevention layer 1030 is deposited to a thickness of 100 nm on lower interconnection 102 by the sputtering or CVD process.

[Step C: Formation of the first electrode] Using the photolithographic technology and the etching technology, an opening for forming first electrode 104 therein is formed in diffusion prevention layer 1030. The opening comprises a through hole reaching the upper surface of lower interconnection 102. Copper is deposed to a thickness equal to greater than the thickness (100 nm) of the diffusion prevention layer 1030 in the formed opening by the sputtering or CVD process. Then, unwanted copper deposits on the diffusion prevention layer 1030 except the opening are scraped off by CMP to planarize the upper surface of the copper layer, thereby forming first electrode 104. Since the planarized upper surface of the first electrode 104 is free of steps, a photoresist will subsequently be coated to a uniform film thickness by photolithography and a film will subsequently be deposited to a uniform thickness.

Figure 5D:
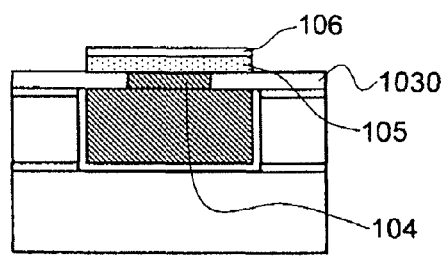
FIG. 5D is a cross-sectional view showing the method of manufacturing the switching device according to the first example.
Figure 5E:
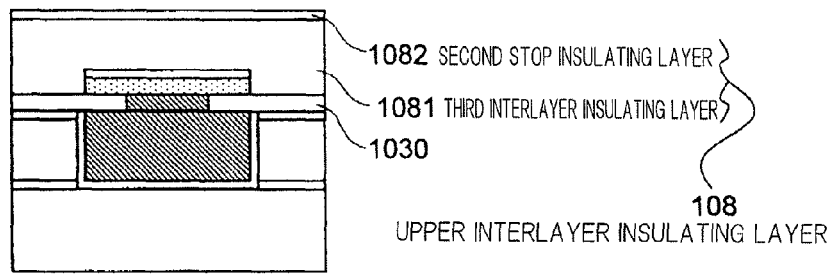
FIG. 5E is a cross-sectional view showing the method of manufacturing the switching device according to the first example.
Figure 5F:
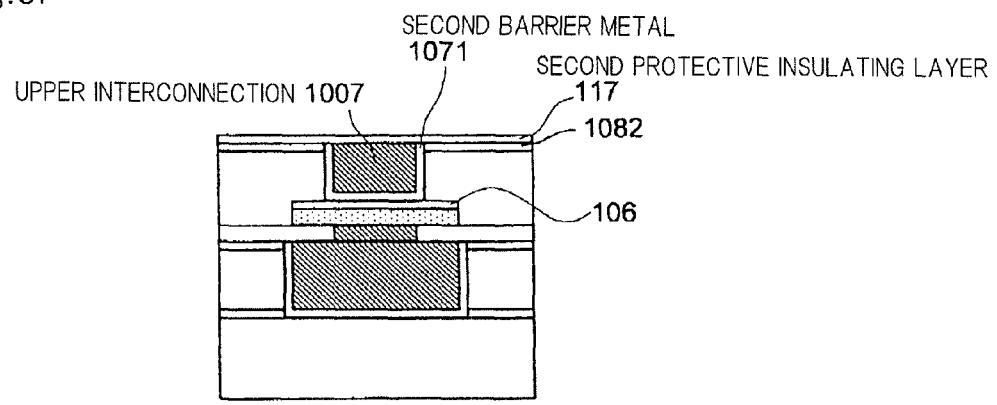
FIG. 5F is a cross-sectional view showing the method of manufacturing the switching device according to the first example.

[Step D: Formation of the ion conduction layer and the second electrode] A tantalum oxide layer for forming ion conduction layer 105 is deposited to a thickness of 15 nm on first electrode 104 by the sputtering or CVD process. Then, a tantalum layer for forming second electrode 106 is deposited to a thickness of 50 nm on the tantalum oxide layer. Using the photolithographic technology and the etching technology, the tantalum oxide layer and the tantalum layer are processed to a pattern covering the upper surface of first electrode 104 and a portion of diffusion prevention layer 1030, thereby forming ion conduction layer 105 and second electrode 106 as shown in FIG. 5D. Second electrode 106 will serve as a stopper when an opening is etched in subsequent [Step F] to minimize any damage caused to ion conduction layer 105 by the etching.

[Step E: Formation of the upper interlayer insulating layer] A silicon oxide film is deposited on diffusion prevention layer 1030 in covering relation to second electrode 106 by CVD. Since the silicon oxide film has steps formed on its upper surface due to second electrode 106 and ion conduction layer 105, the silicon oxide film is planarized into third interlayer insulating layer 1081 by CMP. Third interlayer insulating layer 1081 may have a thickness of about 600 nm. Then, second stop insulating layer 1082 is formed on third interlayer insulating layer 1081. Now, upper interlayer insulating layer 108 made up of a stack of third interlayer insulating layer 1081 and second stop insulating layer 1082 is formed.

[Step F] Using the photolithographic technology and the etching technology, an opening for forming upper interconnection 1007 therein is formed in upper interlayer insulating layer 108. In the etching process, second electrode 106 serves as an etching stopper, and has its upper surface partly exposed in the opening. Second barrier metal film 1071 and a copper seed layer (not shown) serving as part of copper are deposited in the formed opening by the sputtering or CVD process. Then, the copper seed layer may have a thickness in the range from about 20 to 100 nm. The copper seed layer is then plated with copper to a thickness in the range from about 800 to 1200 nm. Unwanted second barrier metal film and copper deposits on upper interlayer insulating layer 108 except the opening are scraped off by CMP, thereby forming upper interconnection 1007 whose lower and side surfaces are covered with second barrier metal film 1071. Upper interconnection 1007 plays the role of a connection plug for electrically connecting interconnections and second electrode 106, as well as its own role as an interconnection. If necessary, a silicon carbonitride film for forming second protective insulating layer 117 is deposited to a thickness of 50 nm on second stop insulating layer 1082 by the sputtering or CVD process. In this manner, the switching device and surrounding interlayer insulating films and interconnections are completed.

The present example provides a basic configuration for the present exemplary embodiment. As described above, various modifications may be made to the present example. Such modifications will be described according to Examples 2 through 10 below. In the examples described below, only basic elements required to construct the switching device will be illustrated, whereas details of the stacked-layer structures in the lower interlayer insulating film and the upper interlayer insulating film will not be described below. However, those details are identical to those described above with respect to Example 1. Details of the manufacturing method which are identical to those of Example 1 will not be described either.

EXAMPLE 2

Figure 6:
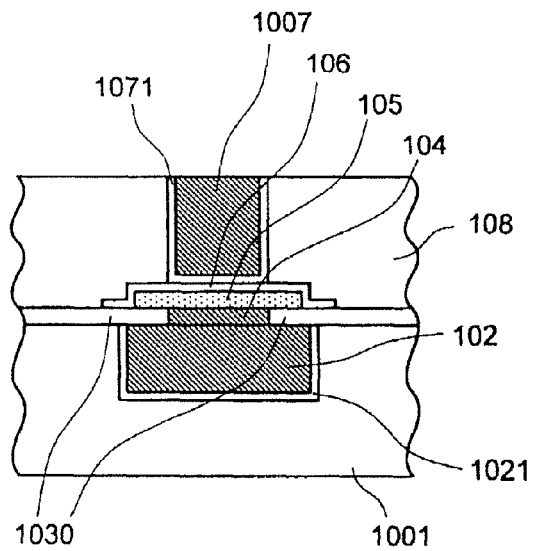
FIG. 6 is a cross-sectional view showing the configuration of a switching device according to a second example.

The present example represents a first modification of the switching device according to the first exemplary embodiment. FIG. 6 is a cross-sectional view showing the configuration of a switching device according to the present example. According to the present example, second electrode 106 covers all the side and upper surfaces of ion conduction layer 105. This structure is effective to prevent copper ions dissolved into the ion conduction layer from being diffused laterally and leaking out of the ion conduction layer.

The structure according to the present example can be produced by modifying [Step D] of Example 1 as follows:

[Step D-1: Formation of the ion conduction layer and the second electrode] A tantalum oxide layer for forming ion conduction layer 105 is deposited to a thickness of 15 nm on first electrode 104 by the sputtering or CVD process. Using the photolithographic technology and the etching technology, ion conduction layer 105 is processed into a shape covering first electrode 104 and part of diffusion prevention layer 1030. Then, in order to form second electrode 106, a tantalum layer having a thickness of about 50 nm is deposited on diffusion prevention layer 1030 in covering relation to ion conduction layer 105 by the sputtering or CVD process. Thereafter, using the photolithographic technology and the etching technology, the tantalum layer is processed into a shape covering ion conduction layer 105 and part of diffusion prevention layer 1030, thereby forming second electrode 106.

EXAMPLE 3

Figure 7:
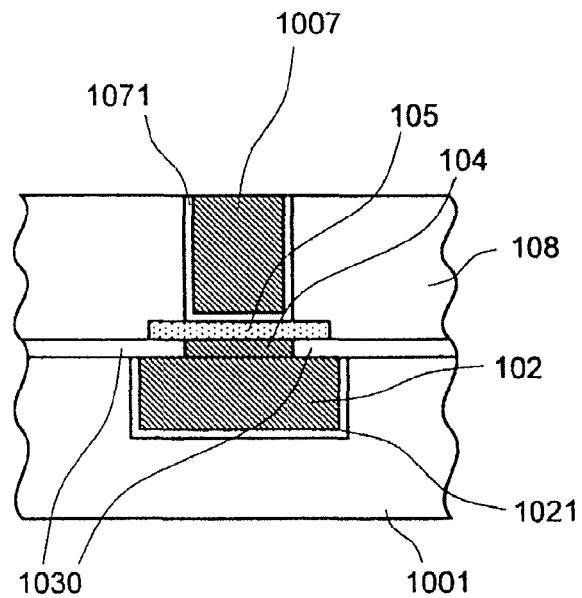
FIG. 7 is a cross-sectional view showing the configuration of a switching device according to a third example.

The present example represents a second modification of the switching device according to the first exemplary embodiment. FIG. 7 is a cross-sectional view showing the configuration of a switching device according to the present example. According to the present example, second electrode 106 is combined with second barrier metal film 1071. According to the present example, the process is simplified by combining the electrode.

For manufacturing the switching device according to the present example, the step of growing the metal film for use as second electrode 106 and the step of patterning the metal film may be dispensed with in [Step D] shown in FIG. 5D.

EXAMPLE 4

Figure 8:
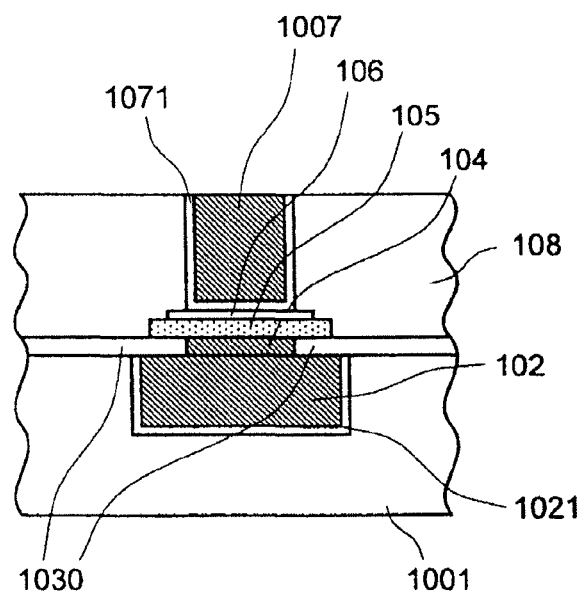
FIG. 8 is a cross-sectional view showing the configuration of a switching device according to a fourth example.

The present example represents a third modification of the switching device according to the first exemplary embodiment. FIG. 8 is a cross-sectional view showing the configuration of a switching device according to the present example. According to the present example, second electrode 106 is disposed in covering relation to an inner region of upper surface of ion conduction layer 105, but not the entire upper surface of ion conduction layer 105.

The switching device according to the present example may be manufactured by changing [Step D] shown in FIG. 5D as follows: After the tantalum oxide film is grown, it is patterned into the pattern of ion conduction layer 105 as shown in FIG. 8. Thereafter, a tantalum film is grown on ion conduction layer 105 and patterned into second electrode 106. Alternatively, when ion conduction layer 105 and second electrode 106 are etched altogether as described above with reference to FIG. 5D, they are processed at different etching rates for their materials to produce the structure according to the present example. It is desirable that the pattern of second electrode 106 be positioned in superposing relation to the pattern of first electrode 104 with ion conduction layer 105 interposed therebetween.

Since the second electrode 106 is thus formed, the possibility that copper ions dissolved into the ion conduction layer will leak out of the ion conduction layer is lowered also according to the present example. Another advantage is that second electrode 106 and ion conduction layer 105 can be etched with wide margins.

EXAMPLE 5

Figure 9:
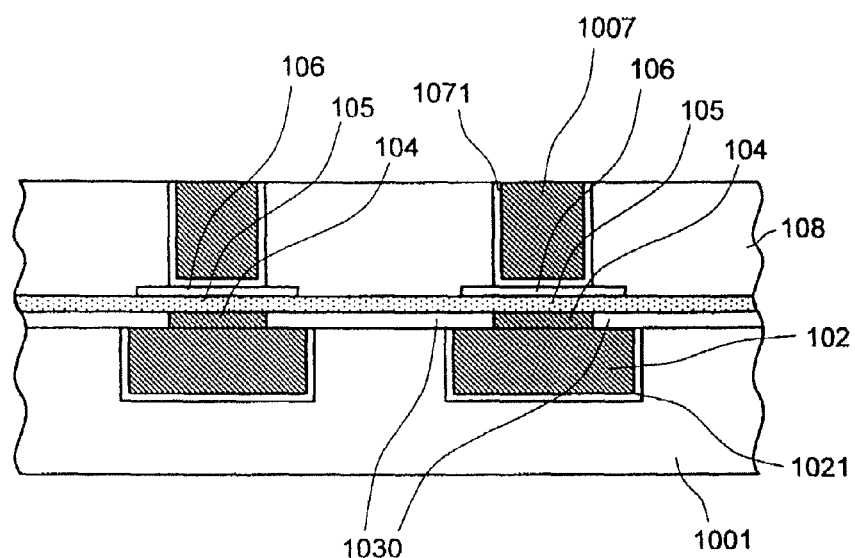
FIG. 9 is a cross-sectional view showing the configuration of a switching device according to a fifth example.

The present example represents a fourth modification of the switching device according to the first exemplary embodiment. FIG. 9 is a cross-sectional view showing the configuration of a switching device according to the present example. FIG. 9 shows two adjacent switching devices disposed on the base body. According to the present example, ion conduction layer 105 is shared by two or more switching devices, as shown in FIG. 9.

For forming a plurality of adjacent switching devices according to the present invention, ion conduction layer 105 is basically divided into regions associated with the respective switching devices. If the diffusion of metal ions between the switching devices causes no problem and the resistance of the ion conduction layer that is free of metal ions is sufficiently high, then the ion conduction layer may not be divided into regions associated with the respective switching devices, but may be shared by the switching devices.

As shown in FIG. 9, first electrodes 104 and second electrodes 106 which are paired are disposed in a plurality of pairs at different positions on common ion conduction layer 105 in confronting relation to each other across ion conduction layer 105, thereby providing a plurality of switching devices on the base body. With this arrangement, since ion conduction layer 105 is not divided, the step of etching ion conduction layer 105 in [Step D] described in Example 1 can be dispensed with, resulting in a simplified process. The arrangement is also effective to prevent etching damage to ion conduction layer 105.

EXAMPLE 6

Figure 10:
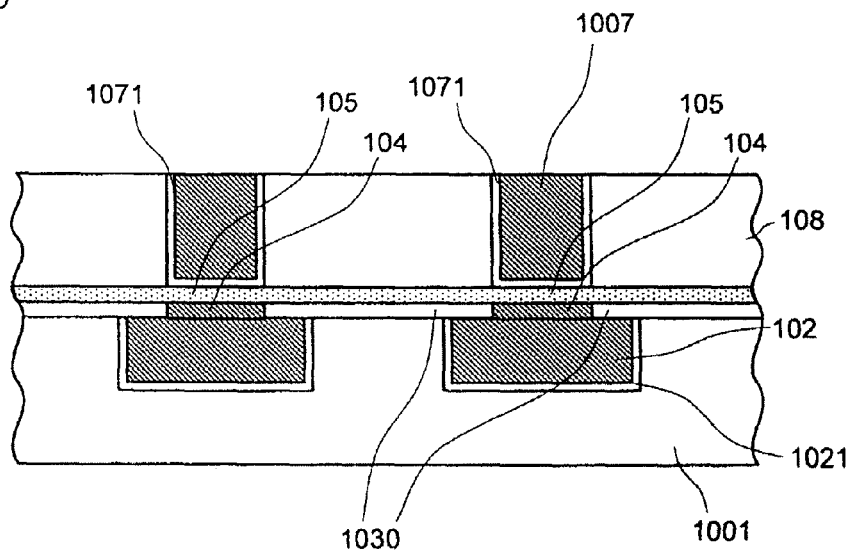
FIG. 10 is a cross-sectional view showing the configuration of a switching device according to a sixth example.

The present example represents a fifth modification of the switching device according to the first exemplary embodiment. FIG. 10 is a cross-sectional view showing the configuration of a switching device according to the present example. FIG. 10 shows two adjacent switching devices disposed on the base body. According to the present example, second barrier metal film 1071 doubles as the second electrode.

The present example is the same as Example 5 in that ion conduction layer 105 used with two or more switching devices is not divided, but shared by the switching devices. The present example is the same as Example 3 in that the second electrodes of the switching devices are combined with second barrier metal films 1071 of upper interconnections 1007. Therefore, the advantages that the step of patterning ion conduction layer 105 is simplified and the step of forming the second electrode is simplified in the process of manufacturing the switching device according to the present example are the same as those of Example 3 and Example 5.

EXAMPLE 7

Figure 11:
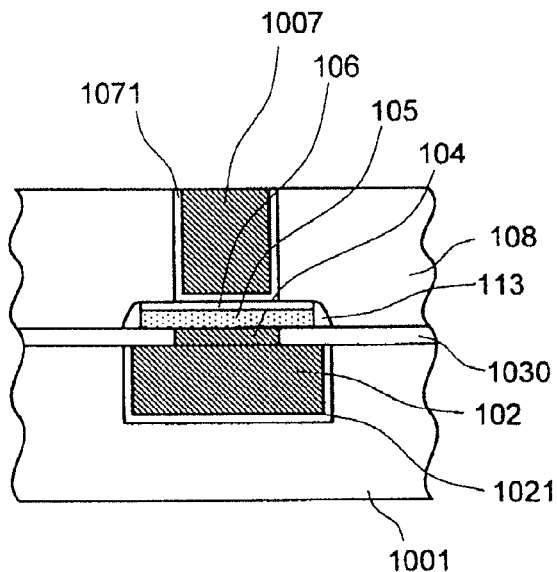
FIG. 11 is a cross-sectional view showing the configuration of a switching device according to a seventh example.

The present example represents a sixth modification of the switching device according to the first exemplary embodiment. FIG. 11 is a cross-sectional view showing the configuration of a switching device according to the present example. The present example is characterized in that second diffusion prevention layer 113 is formed as side walls on the side surfaces of ion conduction layer 105 in the structure of the switching device described above with respect to Example 1. This structure is more effective to prevent copper ions dissolved into the ion conduction layer from being diffused laterally and leaking into the surrounding structure.

The structure according to the present example can be manufactured by the following method: The process details up to the formation of ion conduction layer 105 and second electrode 106 are the same as with Example 1. Thereafter, an insulating film serving as second diffusion prevention layer 113 is formed in covering relation to the upper and side surfaces of second electrode 106, the exposed surface of diffusion prevention layer 1030, and the side surfaces of ion conduction layer 105. The insulating film serving as second diffusion prevention layer 113 comprises a silicon carbonitride film. The silicon carbonitride film is grown by the CVD or sputtering process, for example, to a thickness of about 50 nm. Thereafter, the silicon carbonitride film is processed by anisotropic etching to remove silicon carbonitride deposits on the upper surface of diffusion prevention layer 1030 and the upper surface of ion conduction layer 105. The silicon carbonitride film is now left only on the side surfaces of ion conduction layer 105 and second electrode 106, as second diffusion prevention layer 113 in the form of side walls. Therefore, [Step E] and the subsequent steps are carried as in the same manner as with Example 1, completing the switching device.

EXAMPLE 8

Figure 12:
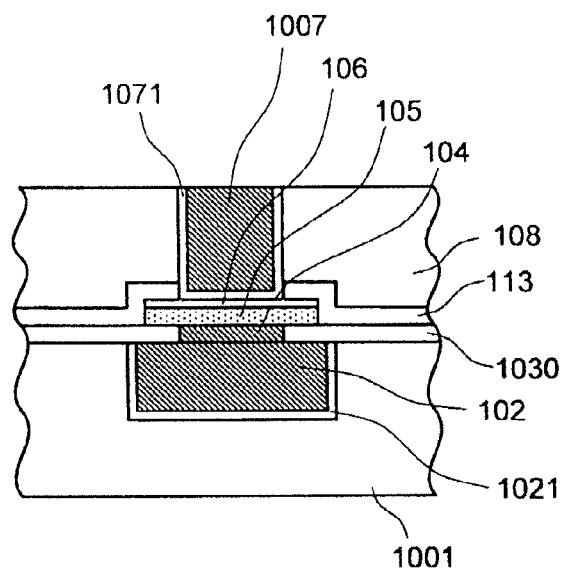
FIG. 12 is a cross-sectional view showing the configuration of a switching device according to an eighth example.

The present example represents a seventh modification of the switching device according to the first exemplary embodiment. FIG. 12 is a cross-sectional view showing the configuration of a switching device according to the present example. The present example is characterized in that second diffusion prevention layer 113 is formed in covering relation to the upper and side surfaces of second electrode 106 and the side surfaces of ion conduction layer 105 in the structure of the switching device described above with respect to Example 1. This structure is more effective to prevent copper ions dissolved into the ion conduction layer from being diffused laterally and leaking into the surrounding structure.

The structure according to the present example can be manufactured by the following method: The process details up to the formation of ion conduction layer 105 and second electrode 106 are the same as with Example 1. Thereafter, an insulating film serving as second diffusion prevention layer 113 is formed in covering relation to the upper and side surfaces of second electrode 106, the exposed surface of diffusion prevention layer 1030, and the side surfaces of ion conduction layer 105. The insulating film serving as second diffusion prevention layer 113 comprises a silicon carbonitride film. The silicon carbonitride film is grown by the CVD or sputtering process, for example, to a thickness of about 50 nm. Thereafter, [Step E] and the subsequent steps are carried as in the same manner as with Example 1, upper interlayer insulating layer 108 is formed, the opening is formed and the upper interconnection is formed, thereby completing the switching device. When the opening in upper interlayer insulating layer 108 is formed, it is edged until the upper surface of second electrode 106 is exposed. Since the portion of second diffusion prevention layer 113 which is aligned with the opening is etched away, upper interconnection 1007 and second electrode 106 are connected to each other through second barrier metal film 1071.

EXAMPLE 9

Figure 13:
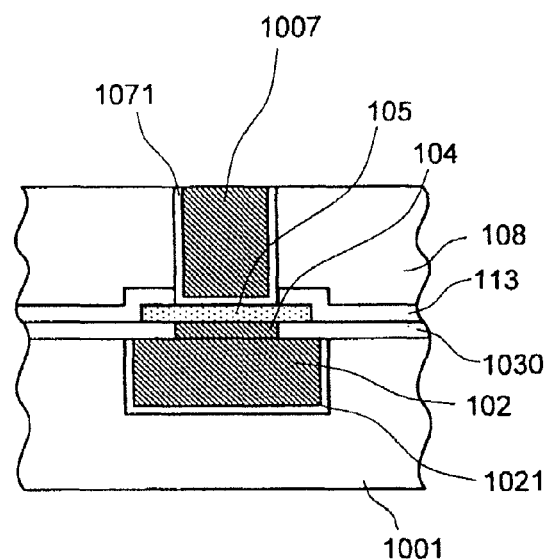
FIG. 13 is a cross-sectional view showing the configuration of a switching device according to a ninth example.

The present example represents an eighth modification of the switching device according to the first exemplary embodiment. FIG. 13 is a cross-sectional view showing the configuration of a switching device according to the present example. The present example is characterized in that second diffusion prevention layer 113 is formed in covering relation to the side surfaces of ion conduction layer 105 in the structure of the switching device described above with respect to Example 3. As shown in FIG. 13, second barrier metal film 1071 doubles as the second electrode of the switching device, as with Example 3. With the structure according to the present example, furthermore, second barrier metal film 1071 may double as the second electrode in the structure wherein second diffusion prevention layer 113 covers the switching device according to Example 8. This structure is more effective to prevent copper ions dissolved into the ion conduction layer from being diffused laterally and leaking into the surrounding structure.

The structure according to the present example can be manufactured by the following method: The process details up to the formation of ion conduction layer 105 and second electrode 106 are the same as with Example 1. Thereafter, an insulating film serving as second diffusion prevention layer 113 is formed in covering relation to the exposed surface of diffusion prevention layer 1030, and the side surfaces of ion conduction layer 105. The insulating film serving as second diffusion prevention layer 113 comprises a silicon carbonitride film. The silicon carbonitride film is grown by the CVD or sputtering process, for example, to a thickness of about 50 nm. Thereafter, as with Example 3, upper interlayer insulating layer 108 is formed, the opening is formed, and the upper interconnection is formed, thereby completing the switching device. When the opening in upper interlayer insulating layer 108 is formed, it is edged until the upper surface of ion conduction layer 105 is exposed. Since the portion of second diffusion prevention layer 113 which is aligned with the opening is etched away, second barrier metal film 1071 is held in contact with ion conduction layer 105.

EXAMPLE 10

Figure 14:
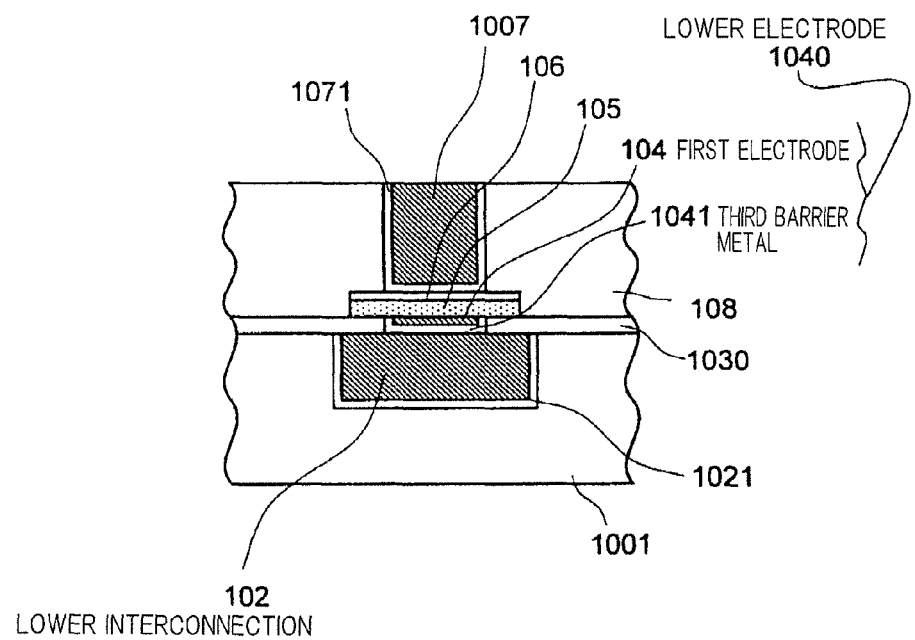
FIG. 14 is a cross-sectional view showing the configuration of a switching device according to a tenth example.

The present example represents a ninth modification of the switching device according to the first exemplary embodiment. FIG. 14 is a cross-sectional view showing the configuration of a switching device according to the present example. The present example is structurally characterized in that lower electrode 1040 of the switching device is constructed of a stacked-layer structure comprising third barrier metal film 1041 and first electrode 104 which performs the ion supply function.

Lower electrode 1040 and an external interconnection are connected to each other by lower interconnection 102 held in contact with the lower surface of third barrier metal film 1041. If interconnections are formed of Cu according to the present LSI process, then they contain a small amount of impurity (e.g., aluminum). According to the present example, as third barrier metal film 1041 which serves as a barrier against the diffusion of an impurity such as aluminum or the like is inserted between lower interconnection 102 and first electrode 104, third barrier metal film 1041 serves as a diffusion prevention layer for preventing the impurity from being diffused into first electrode 104. Accordingly, it is easy to provide a highly pure ion supply electrode for increased switching operation controllability.

The structure according to the present example can be manufactured by the following method: The process is carried out up to the formation of the opening in diffusion prevention layer 1030 according to the manufacturing method described with respect to Example 1. The opening comprises a through hole reaching the upper surface of lower interconnection 102. Thereafter, a TaN film as a barrier metal film having a thickness of 20 nm and a copper film having a thickness of 100 nm are successively formed in covering relation to the opening and diffusion prevention layer 1030 according to the sputtering or CVD process. Then, unwanted TaN and copper deposits on diffusion prevention layer 1030 except for the opening are scraped off by CMD, planarizing the surface of diffusion prevention layer 1030. In this manner, lower electrode 1040 which is of a stacked-layer structure comprising third barrier metal film 1041 and first electrode 104 is formed. There-after, as with Example 1, the films of ion conduction layer 105 and second electrode 106 are formed and patterned, the upper interlayer insulating layer is formed, and the upper interconnection is formed, thereby completing the switching device.

EXAMPLE 11

Diffusion prevention layer 1030 according to Example 1 shown in FIG. 5B and second diffusion prevention layer 113 according to Example 8 shown in FIG. 12 are formed of silicon nitride films. The silicon nitride films are formed by a high-density plasma CVD apparatus. Ammonia is mainly used as a source of nitrogen to be contained in a CVD reaction gas for forming the silicon nitride films. Since the silicon nitride films formed by the above process are impermeable to hydrogen and water, the copper of lower interconnection 102 is prevented from deteriorating in the steps subsequent to the formation of diffusion prevention layer 1030 or second diffusion prevention layer 113.

(Second Exemplary Embodiment)

According to the first exemplary embodiment, a switching device has been described which basically has a pair of electrodes (first and second electrodes) and an ion conduction layer sandwiched by the electrode pair. Though the ion conduction layer may be shared by adjacent switching devices, the electrode pair is independent in each switching device. According to the present exemplary embodiment, the switching element is not limited to only one switch element including a pair of electrodes and an ion conduction layer is used, but comprises a plurality of switch elements.

The switching device according to the present exemplary embodiment serves as a selector device comprising two or more switching devices according to the first exemplary embodiment with one of upper and lower electrodes which sandwich an ion conductor layer therebetween being connected in common.

Figure 15:
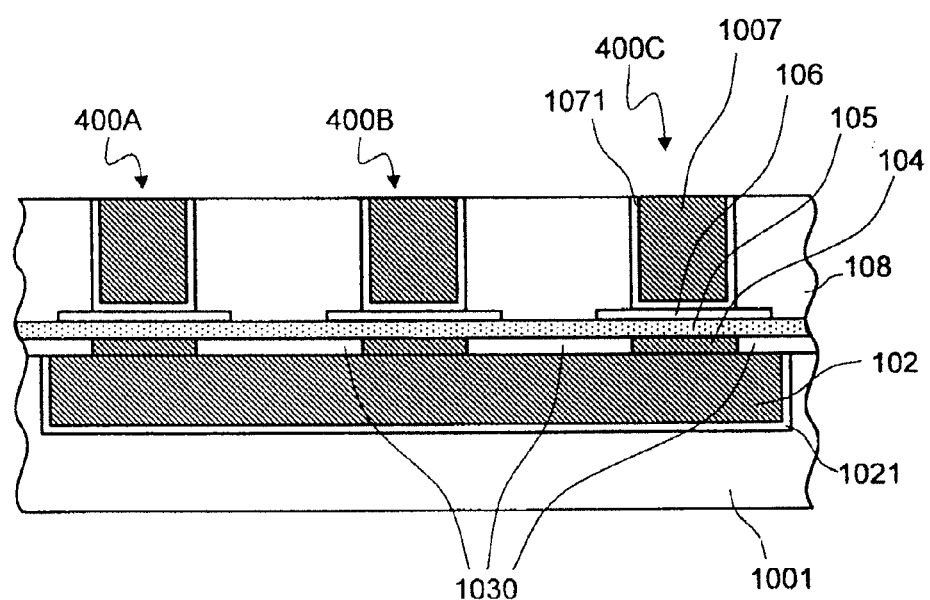
FIG. 15 is a cross-sectional view showing a configurational example of a selector device according to a second exemplary embodiment.

FIG. 15 is a cross-sectional view showing a configurational example of a selector device according to the present exemplary embodiment. The selector device comprises three adjacent switching devices according to the first exemplary embodiment (the switching devices are referred to as switch elements 400A, 400B, 400C from the left in FIG. 15). Lower interconnection 102 connected to first electrodes 104 is shared by switch elements 400A, 400B, 400C. In other words, first electrodes of the three switches are short-circuited and connected to an external circuit.

The switch elements have respective second electrodes 106 (upper electrodes) independently connected to the external circuit. Ion conduction layer 105 in the switch elements is not divided as it is shared by the switch elements in FIG. 15. However, ion conduction layer 105 may be divided into regions associated with the respective switch elements by a process such as etching or the like. However, the undivided ion conduction layer shown in FIG. 15 is more advantageous from the standpoints of miniaturization and damage reduction.

Operation of the selector device shown in FIG. 15 will briefly be described below. In the structure shown in FIG. 15, either one of a plurality of upper interconnections that are connected independently to respective switch elements 400A, 400B, 400C is selected and a voltage is applied to the selected interconnection to operate as a selector for controlling the conduction state between the selected interconnection and the first electrode. In other words, this structure makes up a 1-to-3 selector device.

The number of switch elements to be arrayed is not particularly limited insofar as it is two or greater. The switch elements may be arranged in a one-dimensional array as shown in FIG. 15 or may be arranged in a two-dimensional array (in a plane) including a plurality of switch elements extending from the respective switch elements shown in FIG. 15 in a direction away from the viewer of FIG. 15.

Figure 16:
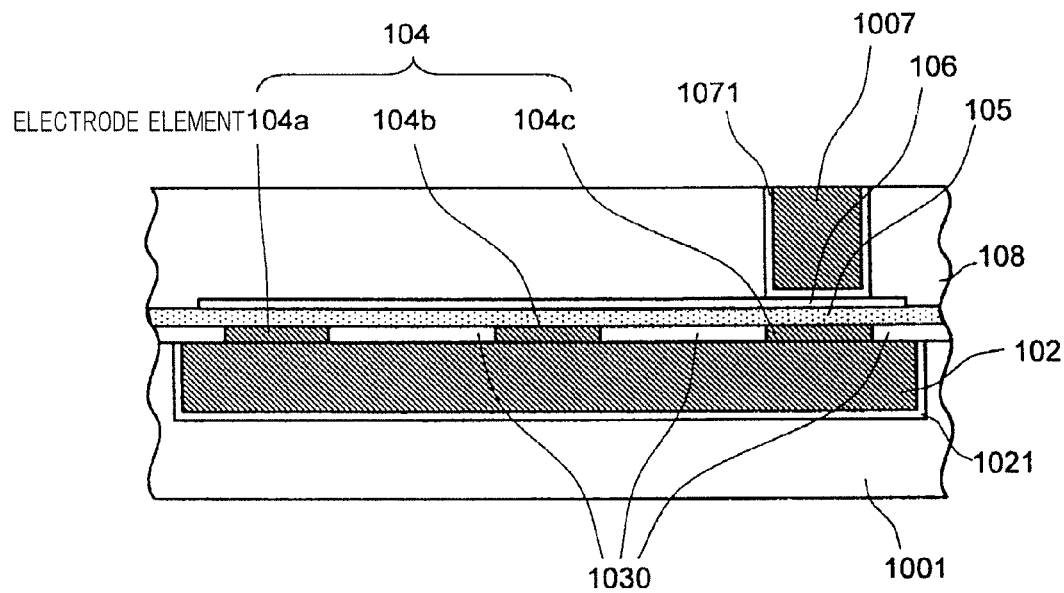
FIG. 16 is a cross-sectional view showing another configurational example of the selector device according to the second exemplary embodiment.

Another configurational example of the selector device according to the present exemplary embodiment will be described below. According to the other configurational example, the selector device comprises two or more switch elements, and not only ones of upper and lower electrodes which sandwich an ion conduction layer therebetween, but also the other ones are also connected in common. FIG. 16 is a cross-sectional view showing the other configurational example of the selector device according to the present exemplary embodiment.

With the structure shown in FIG. 16, a plurality of switch elements (three switch elements in FIG. 16) are connected parallel to each other. Second electrode 106 is used in common, and first electrode 104 comprises a plurality of electrode elements 104a, 104b, 104c. In FIG. 16, ion conduction layer 105 is shared by the switch elements and hence is not divided. However, ion conduction layer 105 may be divided into regions associated with the respective switch elements by etching.

The selector device thus constructed is equivalent to a simple switching device in terms of an electric circuit, and makes up a switching device of low on-resistance as a whole. The selector device is advantageous for miniaturization as low interconnection 102, ion conduction layer 105, and second electrode 106 are used in common. The selector device may have one or more plugs for connecting second electrode 106 to an external circuit. In FIG. 16, the selector device has one interconnection plug. Upper interconnection 1007 shown in FIG. 16 serves as an interconnection plug.

Advantages with respect to the characteristics and the method of manufacturing the switching device according to the present exemplary embodiment will be described below.

As described above with respect to the manufacturing method according to the first exemplary embodiment, first electrode 104 can be formed by growing a metal film of copper or the like in the opening that has been defined in the insulating film and thereafter removing unwanted portions of the metal film according to CMP. When the copper film is processed by CMP, however, the copper film is polished faster in a central region of the opening than in a peripheral region of the opening, tending to give rise to a phenomenon called dishing which represents a cavity in the surface. It is known that this phenomenon manifests itself when a material is embedded in an opening of large dimensions.

As described above, if it is important for the switching device to have a low on-resistance, then it is advantageous to increase an effective switch area that is represented by the area in which the pattern of first electrode 104 and the pattern of second electrode 106 overlap each other with ion conduction layer 105 being interposed therebetween. However, simply increasing the size of a pair of electrodes brings about the problem of dishing referred to above, degrading the planarity of the interface between the first electrode and the ion conduction layer. The deficiency becomes an obstacle to the subsequent manufacturing steps and is also responsible for switching voltage variations.

The switching device structures shown in FIGS. 15 and 16 may be regarded as including a plurality of segments divided from first electrode 104 of the switching device according to the first exemplary embodiment and embedded in respective openings in diffusion prevention layer 1030, so that the area of each of the divided electrode segments is reduced. Therefore, the structure according to the present exemplary embodiment can keep the onresistance at a low level and can easily avoid the problem of dishing. The phenomenon of dishing occurs with other metal species though it manifests itself particularly with Cu.

Accordingly, the switch structures wherein the lower electrode is divided into a plurality of electrode elements disposed in the diffusion prevention layer as shown in FIGS. 15 and 16 are useful for all switches utilizing ion conduction, which include not only switches wherein the lower electrode comprises an ion supply electrode of Cu, but also general switches wherein metal electrodes are embedded in diffusion prevention layer openings as switching device electrodes.

Figure 17:
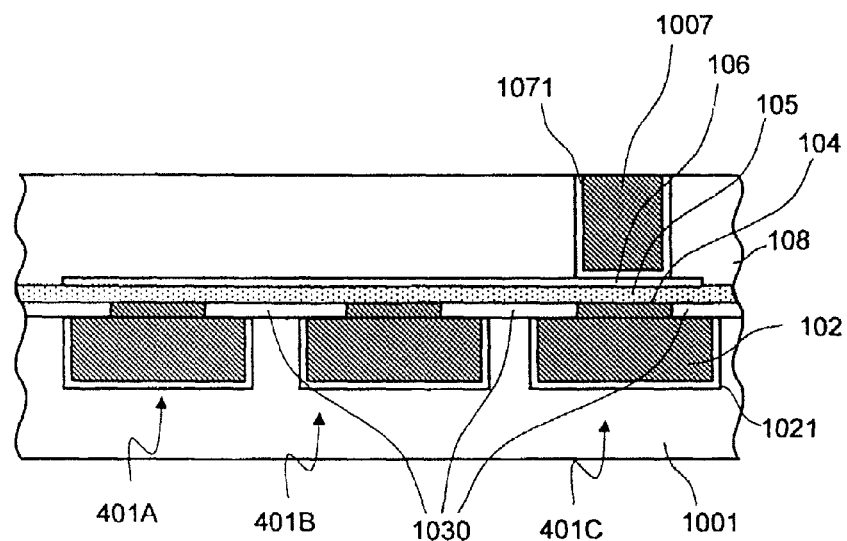
FIG. 17 is a cross-sectional view showing still another configurational example of the selector device according to the second exemplary embodiment.

In the structure shown in FIG. 16, the lower electrode made up a plurality of electrode elements is short-circuited by the common interconnection. However, independent interconnections may be connected to the respective electrode elements, and the electrode elements may not be short-circuited. FIG. 17 is a cross-sectional view showing a configurational example of such a selector device.

As shown in FIG. 17, a plurality of switch elements 401A, 401B, 401C have respective first electrodes 104 connected to individual lower interconnections 102. The selector device thus constructed can function as a 1:n (n is an integer of 2 or greater) selector circuit. FIG. 17 shows a 1:3 selector circuit. This structure is obtained by turning the structure shown in FIG. 15 vertically upside down, and has a plurality of switch elements shared by an upper electrode. In the selector circuit shown in FIG. 17, either one of a plurality of lower interconnections 102 that are connected independently to respective switch elements 401A, 401B, 401C is selected and a voltage is applied to the selected interconnection to operate as a selector for controlling the conduction state between the selected interconnection and the second electrode.

(Third Exemplary Embodiment)

The present exemplary embodiment represents an application of a switching device disposed in the multilayer interconnection structure of a semiconductor device, wherein an MIM (metal/insulating layer/metal) capacitor is disposed in the same interconnection layer as with the switching device.

The MIM capacitor in the semiconductor device has a three-layer structure including a metal electrode, a dielectric layer, and a metal electrode and disposed in an insulating layer, similar to the switching devices according to the first and second exemplary embodiments. The MIM capacitor uses a dielectric material having a large dielectric constant for achieving a large electrostatic capacitance with a small area. One typical dielectric material is tantalum oxide, which can be used as a material for the ion conduction layer. Therefore, the MIM capacitor and the switching device which utilizes ion conduction are suitable for being formed in the same interconnection layer according to the same process.

Figure 18:
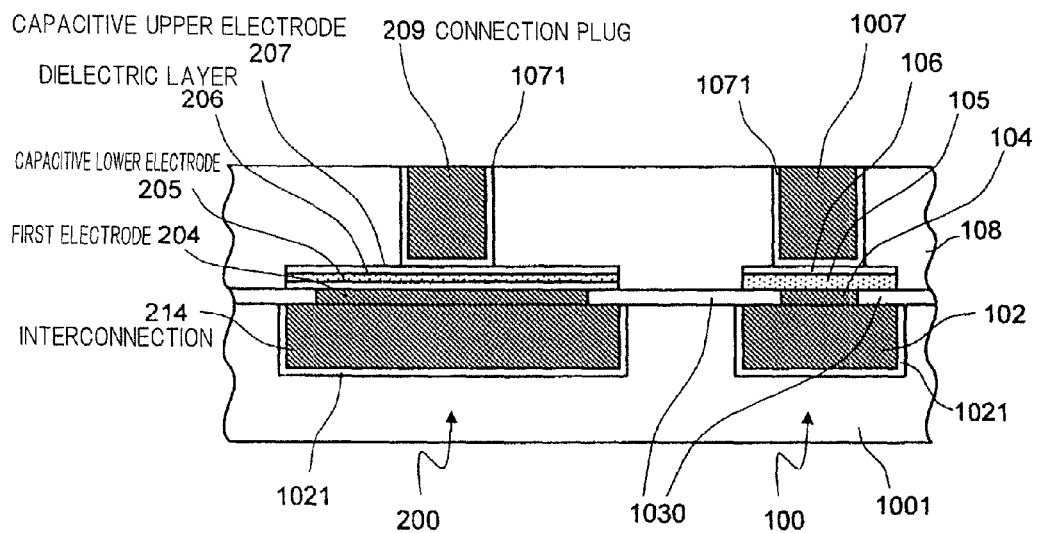
FIG. 18 is a cross-sectional view showing a configurational example of a semiconductor device having a multilayer interconnection structure in which a switching device and an MIM capacitor are disposed.

FIG. 18 is a cross-sectional view showing a configurational example wherein a switching device (right in FIG. 18) and an MIM capacitor (left in FIG. 18) are disposed in the multilayer interconnection layer of a semiconductor device. Capacitor 200 comprises capacitive lower electrode 205, dielectric layer 206, and capacitive upper electrode 207. Capacitive upper electrode 207 is connected to an interconnection (not shown) by connection plug 209, and capacitive lower electrode 205 is connected to interconnection 214 by first electrode 204. Connection plug 209 of capacitor 200 corresponds to upper interconnection 1007 of switching device 100. Connection plug 209 has bottom and side surfaces covered with second barrier metal film 1071. Interconnection 214 has bottom and side surfaces covered with first barrier metal film 1021. Switching device 100 is of the same configuration as the configuration described with reference to FIG. 3, and will not be described in detail below.

The structure shown in FIG. 18 can be formed simultaneously with capacitor 200 by a process which is essentially the same as the process of manufacturing the switching device according to the first exemplary embodiment. A manufacturing method will briefly be described below.

With respect to both the capacitor section and the switch section, the process details from the formation of the interconnection in lower interlayer insulating layer 1001 up to the formation of first electrodes 104, 204 in diffusion prevention layer 1030 are the same as with those of the process of manufacturing the switch alone. Thereafter, a metal film (e.g., of tantalum) which serves as capacitive lower electrode 205 of the capacitor section is formed and patterned to leave a metal film only in a capacitor forming region, forming capacitive lower electrode 205 connected to first electrode 204 in the capacitor section. Then, a tantalum oxide film and a tantalum film are formed and patterned to form ion conduction layer 105 and second electrode 106 of the switch section and dielectric layer 206 and capacitive upper electrode 207 of the capacitor section simultaneously with each other. Then, upper interlayer insulating layer 108, upper interconnection 1007, and connection plug 209 are formed, thereby completing the structure shown in FIG. 18.

In this manner, the switching device can be formed simultaneously with another structure by a simple process with a high yield.

Reminders about the method of manufacturing the structure according to the present exemplary embodiment will be described below. The MIM capacitor usually takes up a greater area in the surface of the base body than the switching device in order to achieve the capacitance. For the purpose of achieving the capacitance, it is desirable to reduce the thickness of dielectric layer 206 of the MIM capacitor as much as possible. If the thickness of dielectric layer 206 is different from the thickness of ion conduction layer 105 of the switching device, then they need to be grown individually though they can be processed simultaneously. Although the MIM capacitor is structurally similar to the switching device, the MIM capacitor does not form a metal bridge by applying a voltage between the electrodes because the MIM capacitor is entirely different operationally from the switching device which utilizes an electrochemical reaction. Therefore, capacitive upper electrode 207 and capacitive lower electrode 205 should desirably be made of a conductor such as Ta or TaN which does not supply ions.

The combination of the switching device and the MIM capacitor applied to the semiconductor device has been described above with reference to FIG. 18. The structure according to the present exemplary embodiment can also be applied to various semiconductor devices using the switching device.

The switching devices according to the first and second exemplary embodiments are highly advantageously applicable to programmable logic circuits such as FPGA, DRP, or the like wherein a plurality of logic cells are interconnected through switches as described above with respect to the background art. The switching devices are optimally applicable to those circuits because the switch using the ion conductor essentially has a low on-resistance and a small size and also is highly reliable as it prevents the surrounding structure from being contaminated.

Figure 19:
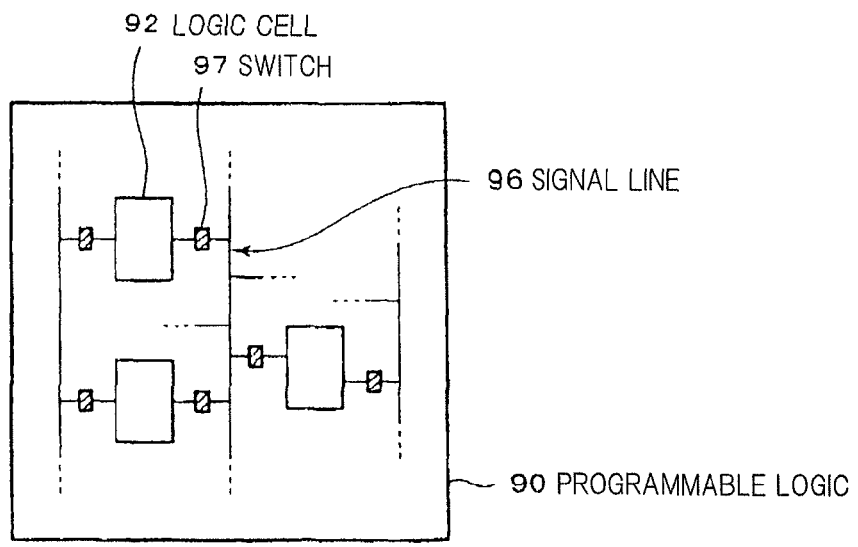
FIG. 19 is a block diagram showing a configurational example of a programmable logic device which incorporates switching devices according to the first exemplary embodiment.

The two-terminal switch according to the first exemplary embodiment as it is applied to a programmable logic device will be described below. FIG. 19 is a block diagram showing a configurational example of a programmable logic device.

As shown in FIG. 19, programmable logic device 90 comprises a number of logic cells 92 arranged in a two-dimensional array, interconnections connecting the logic cells to each other, and a number of switches 97 for selectively connecting and disconnecting the interconnections. By changing the connection states (connected and unconnected states) of the two-terminal switches, it is possible to establish a layout of interconnections between logic cells, functions of logic cells, etc. to produce a logic integrated circuit which meets desired specifications.

The two-terminal switch according to the first exemplary embodiment is applied to each of programming switches 97. As shown in FIG. 19, one of the two terminals of each switch 97 is connected to logic cell 92 and the other terminal to signal line 96 in programmable logic device 90.

Switch 97 which is set to an on-state keeps logic cell 92 and signal line 96 electrically connected to each other. A logic signal is supplied through signal line 96 and switch 97 and enters logic cell 92. Conversely, switch 97 which is set to an off-state keeps logic cell 92 and signal line 96 electrically disconnected from each other. A logic signal which is supplied through signal line 96 to switch 97 does not enter logic cell 92. In this manner, programmable logic device 90 allows the user to establish a connection state of logic cells.

The two-terminal switch according to the first exemplary embodiment as it is applied to each of the switches of the programmable logic device is effective to prevent metal ions from leaking out and hence makes the programmable logic device more reliable.

The switching devices according to the first and second exemplary embodiments can also be applied to memories. For example, a nonvolatile memory is constructed of a matrix of memory cells, each comprising a selective device such as a transistor and a switching device according to the present invention. Any desired one of the memory cells is selected by signals supplied to word lines and bit lines. The conduction state of the switching device of the selected memory cells is sensed to read information of either "1" or "0". The switching devices which are applied to those memory elements are advantageous because each memory element has a low on-resistance and a small size and also is highly reliable.

Figure 20:
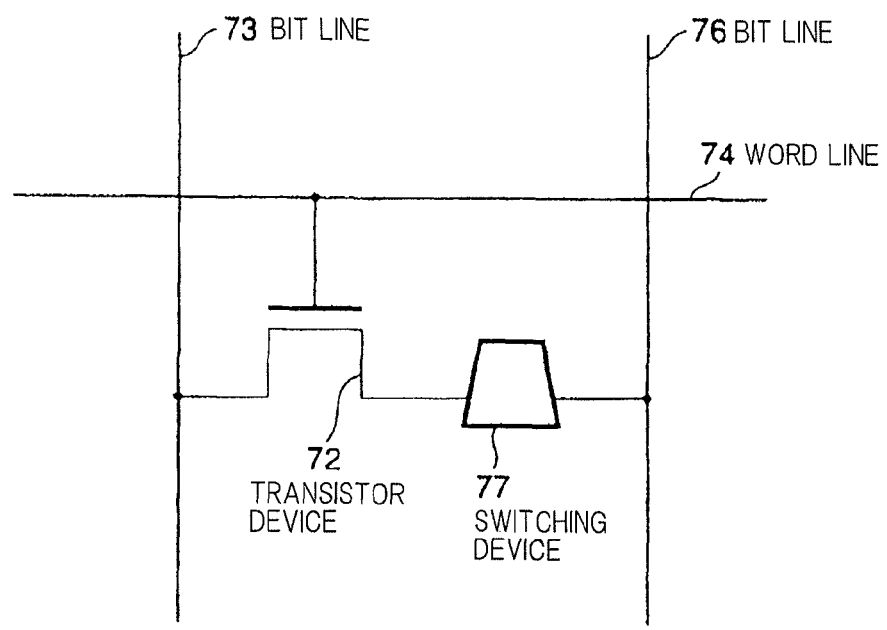
FIG. 20 is a block diagram showing a configurational example of a memory element which incorporates a switching device according to the first exemplary embodiment.

FIG. 20 is a block diagram showing a configurational example of a memory element. As shown in FIG. 20, the memory element comprises switching device 77 for holding information and transistor device 72 for reading information from switching device 77. The two-terminal switch according to the first exemplary embodiment is applied to switching device 77.

Transistor device 72 has a source electrode connected to bit line 73 and a gate electrode connected to word line 74. One of the two terminals of switching device 77 is connected to bit line 76 and the other terminal to the drain electrode of transistor device 72.

A process of writing information into the memory element will be described below. The switching device holds information "1" when it is in an on-state and information "0" when it is in an off-state. Transistor device 72 has operating voltage VR.

For writing information "1" into the memory element, voltage VR is applied to word line 74 to turn on transistor device 72, and switching device 77 is turned on. Information "1" is now written in switching device 77.

For writing information "0" into the memory element, voltage VR is applied to word line 74 to turn on transistor device 72, and switching device 77 is turned off. Information "0" is now written in switching device 77.

A process of reading information held by the memory element will be described below.

Voltage VR is applied to word line 74 to turn on transistor device 72 to increase the resistance value between bit line 73 and bit line 76. The resistance value is represented by the sum of the on-resistance of transistor device 72 and the resistance value of switching device 77. If the sum resistance value is so large that is cannot be measured, then switching device 77 is judged as being turned off, indicating that the information held by the memory element is "0". If the sum resistance value is smaller than a predetermined value, then switching device 77 is judged as being turned on, indicating that the information held by the memory element is "1".

If the two-terminal switch according to the present invention is used as a switching device for holding information, then metal ions are prevented from leaking out. If the memory element according to the present exemplary embodiment is used in a memory device comprising an array of memory elements, then the memory device has increased reliability. A diode may be used instead of the transistor device.

(Fourth Exemplary Embodiment)

The two-terminal switching devices have been described above in accordance with the first and second exemplary embodiments. The present exemplary embodiment is concerned with a three-terminal switching device including a third electrode held in contact with the ion conductor layer, added to the structure of the two-terminal switching device.

Figure 21:
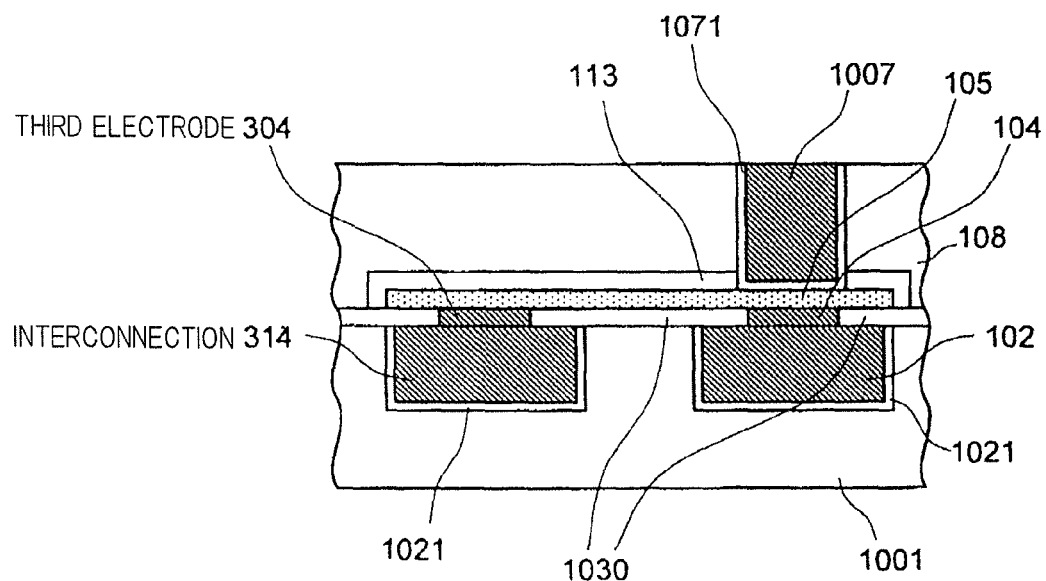
FIG. 21 is a cross-sectional view showing a configurational example of a switching device according to a fourth exemplary embodiment.

FIG. 21 is a cross-sectional view showing a configurational example of a switching device according to the present exemplary embodiment.

FIG. 21 shows in its right half portion a structure in which ion conduction layer 105 is vertically sandwiched between an upper electrode and a lower electrode. This structure is the same as the structure according to the first exemplary embodiment. Since the structure comprises the switching device according to Example 9 shown in FIG. 13, the upper electrode comprises second barrier metal film 1071 and the lower electrode comprises first electrode 104. As shown in a left half portion of FIG. 21, the switching device includes third electrode 304 held in contact with ion conduction layer 105 according to the present exemplary embodiment. Third electrode 304 is disposed in an opening in diffusion prevention layer 1030 and connected to interconnection 314 disposed in lower interlayer insulating layer 1001. Interconnection 314 has bottom and side surfaces covered with first barrier metal film 1021. Third electrode 304 is made of a material having an ion supply function, such as copper or the like. Ion conduction layer 105 has upper and side surfaces covered with second diffusion prevention layer 113.

The switching device according to the present exemplary embodiment is structurally characterized in that ion conduction layer 105 extends (leftwardly in FIG. 21) out of the region wherein ion conduction layer 105 is sandwiched between first electrode 104 and second barrier metal film 1071, and third electrode 304 is held in contact with the extension of ion conduction layer 105. The switching device is operationally characterized in that the conduction state between first electrode 104 and the second electrode is controlled by controlling a voltage applied to third electrode 304 which serves as a control electrode. Second barrier metal film 1071 will hereinafter be referred to as second electrode 1071.

A first method of controlling the conduction state between first electrode 104 and second electrode 1071 is performed as follows: When a positive voltage is applied between first electrode 104 and second electrode 1071, third electrode 304 supplies metal ions into the ion conduction layer, and the metal ions are diffused through the ion conduction layer and precipitated between second electrode 1071 and first electrode 104. First electrode 104 and second electrode 1071 are connected to each other by the precipitated metal, turning on the switching device. For bringing the switching device from the on-state to the off-state, a voltage which is negative with respect to third electrode 304 is applied between first electrode 104 and second electrode 1071, or the same voltage as the voltage applied to turn off the normal two-terminal switching device is applied, thereby eliminating the metal bridge.

A second method of controlling the conduction state between first electrode 104 and second electrode 1071 is performed as follows: For changing the switching device from the initial state to the on-state, the same voltage as the voltage applied to turn on the normal two-terminal switching device is applied between first electrode 104 and second electrode 1071 to cause first electrode 104 to supply ions, thereby forming a metal bridge interconnecting first electrode 104 and second electrode 1071. Then, a voltage which is positive with respect to third electrode 304 is applied between first electrode 104 and second electrode 1071 to cause third electrode 304 to supply ions to enlarge the metal bridge that has been formed. The switching device now has a low on-resistance. For bringing the switching device from the on-state to the off-state, a voltage which is negative with respect to third electrode 304 is applied between first electrode 104 and second electrode 1071, or the same voltage as the voltage applied to turn off the normal two-terminal switching device is applied, thereby eliminating the metal bridge.

A third method of controlling the conduction state between first electrode 104 and second electrode 1071 is performed as follows: For changing the switching device from the initial state to the on-state, the same voltage as the voltage applied to turn on the normal two-terminal switching device is applied between first electrode 104 and second electrode 1071 to cause first electrode 104 to supply ions, thereby forming a metal bridge interconnecting first electrode 104 and second electrode 1071. For bringing the switching device from the on-state to the off-state, the same voltage as the voltage applied to turn off the normal two-terminal switching device is applied, thereby eliminating the metal bridge.

According to the first control method, first electrode 104 of the three-terminal switching device of the structure shown in FIG. 21 may not be an electrode capable of supplying ions. For example, first electrode 104 and second electrode 1071 may be made of tantalum, and only third electrode 304 may be made of copper.

Figure 22:
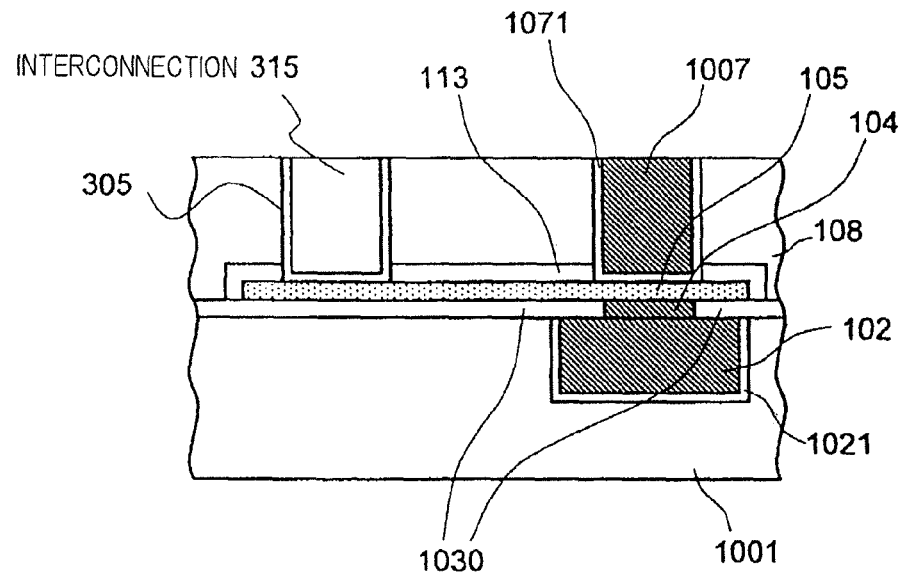
FIG. 22 is a cross-sectional view showing another configurational example of the switching device according to the fourth exemplary embodiment.

According to the third method, first electrode 104 of the three-terminal switching device of the structure shown in FIG. 21 may be an electrode capable of supplying ions and second electrode 1071 and third electrode 304 may be an electrode, made of tantalum, for example, which does not supply ions. Third electrode 304 may thus be disposed on the upper surface, not on the lower surface, of the extension of ion conduction layer 105 shown in FIG. 21. FIG. 22 shows the third electrode disposed on the upper surface of the ion conduction layer. As shown in a left portion of FIG. 22, third electrode 305 is disposed in upper interlayer insulating layer 108 in contact with ion conduction layer 105. Third electrode 305 is same material as second barrier metal film 1071. With this structure, the manufacturing process is simplified because the process of forming third electrode 305 and interconnection 315 and the process of forming second barrier metal film 1071 and upper interconnection 1007 can be performed in common.

The three-terminal switching device is also advantageous in that since the electrode having the metal ion supply function is embedded in the opening in the insulating layer having the diffusion prevention function, metal ions are prevented from leaking into the surrounding structure.

Figure 23:
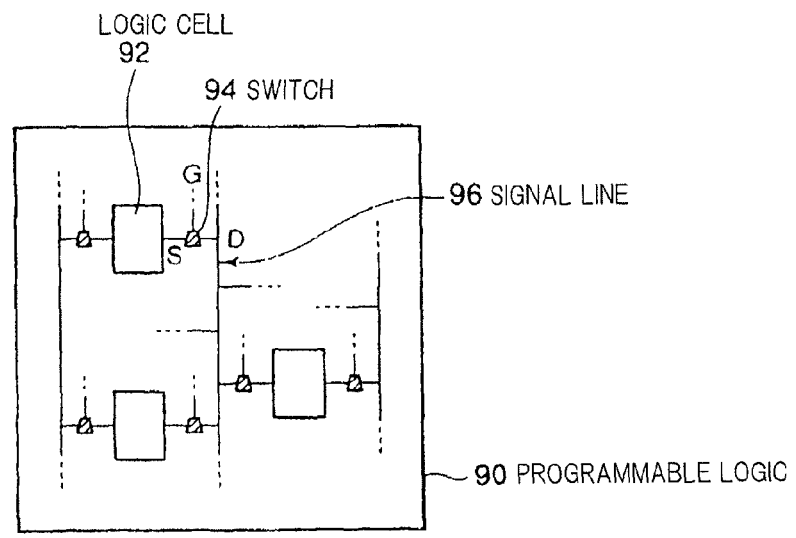
FIG. 23 is a block diagram showing a configurational example of a programmable logic device which incorporates switching devices according to the fourth exemplary embodiment.

The switching device according to the present exemplary embodiment as it is applied to programming switches of a programmable logic device will be described below. FIG. 23 is a block diagram showing a configurational example of a programmable logic device.

As shown in FIG. 23, programmable logic device 90 comprises a number of logic cells 92 arranged in a two-dimensional array, interconnections connecting the logic cells to each other, and a number of switches 94 for selectively connecting and disconnecting the interconnections. By changing the connection states (connected and unconnected states) of the three-terminal switches, it is possible to establish a layout of interconnections between logic cells, functions of logic cells, etc. to produce a logic integrated circuit which meets desired specifications.

Each of switches 94 comprises a transistor device including drain electrode D, source electrode S, and gate electrode G. With the three-terminal switch according to the present exemplary embodiment being applied to a programming switch, the first electrode corresponds to drain electrode D, the second electrode to source electrode S, and the third electrode to gate electrode G. As shown in FIG. 22, source electrode S is connected to logic cell 92, and drain electrode D to signal line 96 in programmable logic device 90.

Switch 94 which is set to an on-state keeps source electrode S and drain electrode D electrically connected to each other. When a logic signal is supplied through signal line 96 to drain electrode D, it enters logic cell 92 through source electrode S. Conversely, switch 94 which is set to an off-state keeps source electrode S and drain electrode D electrically disconnected from each other. When a logic signal is supplied through signal line 96 to drain electrode D, it does not enter logic cell 92 connected to source electrode S. In this manner, programmable logic device 90 allows the user to establish a connection state of logic cells.

The three-terminal switch according to the present exemplary embodiment as it is applied to each of the switches of the programmable logic device is effective to prevent metal ions from leaking out and hence makes the programmable logic device more reliable.

Figure 24:
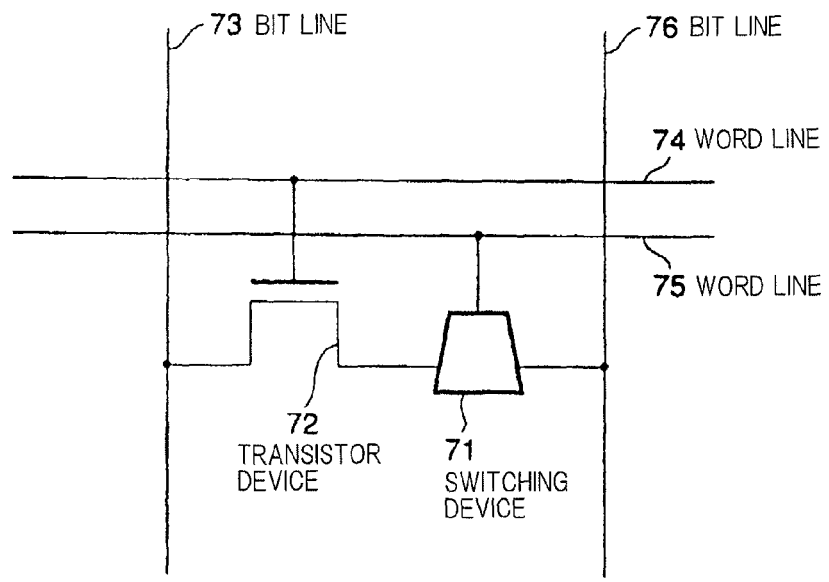
FIG. 24 is a block diagram showing a configurational example of a memory device which incorporates a switching device according to the fourth exemplary embodiment.

The switching device according to the present exemplary embodiment as it is applied to a memory element will be described below. FIG. 24 is a block diagram showing a configurational example of a memory element.

As shown in FIG. 24, the memory element comprises switching device 71 for holding information and transistor device 72 for reading information from switching device 71. The three-terminal switch according to the present exemplary embodiment is applied to switching device 71. Switching device 71 is structurally identical to a transistor including a drain electrode, a source electrode, and a gate electrode. These electrodes correspond to the first, second, and third electrodes of the three-terminal switch according to the present exemplary embodiment.

Transistor device 72 has a source electrode connected to bit line 73 and a gate electrode connected to word line 74. Switching device 71 has a source electrode connected to bit line 76 and a gate electrode connected to word line 75. The drain electrode of switching device 71 is connected to the drain electrode of transistor device 72.

A process of writing information into the memory element will be described below. The switching device holds information "1" when it is in an on-state and information "0" when it is in an off-state. The switching device has switching voltage Vt and transistor device 72 has operating voltage VR. For writing information "1" into the memory element, voltage Vt is applied to word line 75 and a voltage of 0 V is applied to bit line 76. A voltage of (Vt/2) is applied to bit line 73. Switching device 71 is turned on with information "1" written therein. For writing information "0" into the memory element, a voltage of 0 V is applied to word line 75 and voltage Vt is applied to bit line 76. A voltage of (Vt/2) is applied to bit line 73. Switching device 71 is turned off with information "0" written therein.

A process of reading information held by the memory element is the same as the process described with respect to the third exemplary embodiment, and will not be described below.

If the three-terminal switch according to the present invention is used as a switching device for holding information, then metal ions are prevented from leaking out. If the memory element according to the present exemplary embodiment is used in a memory device comprising an array of memory elements, then the memory device has increased reliability.

Only the basic configurations according to the second, third, and fourth exemplary embodiments have been described above. However, each of the switching devices may be modified according to the modifications illustrated with respect to the first exemplary embodiment, and the materials of the components may be modified. The present invention is not limited to the above exemplary embodiments, and various modifications may be made within the scope of the present invention and may fall within the scope of the present invention.

This application is based upon and claims the benefit of priority from Japanese Patent Application No. 2006-175872 filed on Jun. 26, 2006, the content of which is incorporated by reference.

The invention claimed is:

1. A switching device comprising:
   a first insulating layer having an opening and made of a material for preventing metal ions from being diffused;
   a first electrode disposed in said opening and including a material capable of supplying said metal ions;
   an ion conduction layer disposed in contact with an upper surface of said first electrode and capable of conducting said metal ions; and
   a second electrode disposed in contact with an upper surface of said ion conduction layer and including a region made of a material incapable of said metal ions;
   wherein a voltage is applied between said first electrode and said second electrode for controlling a conduction state between said first electrode and said second electrode, and
   wherein said second electrode covers said upper surface of said ion conduction layer in its entirety.

2. The switching device according to claim 1, wherein said first electrode has a portion held in contact with said ion conduction layer and including at least a portion which is of a composition capable of supplying said metal ions into said ion conduction layer.

3. The switching device according to claim 1, wherein said second electrode has a portion held in contact with said ion conduction layer and including at least a portion which is of a composition incapable of supplying said metal ions into said ion conduction layer.

4. The switching device according to claim 1, wherein said first insulating layer comprises an insulator having a function to prevent said metal ions from being diffused.

5. The switching device according to claim 1, wherein said first insulating layer and said first electrode are mounted on a base body.

6. The switching device according to claim 5, wherein said base body includes a lower insulating layer on a surface thereof and a lower interconnection disposed in said lower insulating layer, said lower interconnection having an upper surface held in contact with a lower surface of said first electrode.

7. The switching device according to claim 1, wherein said ion conduction layer covers said upper surface of said first electrode and covers a portion of said first insulating layer.

8. The switching device according to claim 1, wherein said second electrode covers a surface of said ion conduction layer at a position facing at least said first electrode on said upper surface of said ion conduction layer.

9. The switching device according to claim 1, wherein said second electrode covers said upper surface and side surfaces of said ion conduction layer.

10. The switching device according to claim 1, comprising a second insulating layer disposed on a surface of said second electrode, which is opposite to a surface thereof held in contact with said ion conduction layer, said second insulating layer comprising an insulator having a function to prevent said metal ions from being diffused.

11. The switching device according to claim 1, comprising a second insulating layer disposed on a side surface of said ion conduction layer, said second insulating layer comprising an insulator having a function to prevent said metal ions from being diffused.

12. The switching device according to claim 1, comprising a second insulating layer covering upper and side surfaces of a stacked-layer structure made up of said ion conduction layer and said second electrode, said second insulating layer comprising an insulator having a function to prevent said metal ions from being diffused.

13. The switching device according to claim 1, wherein said insulating layer has a plurality of openings, said first electrode having a plurality of electrode elements disposed in said openings, said electrode elements having respective upper surfaces held in contact with said ion conduction layer and respective lower surfaces connected by a common lower interconnection.

14. The switching device according to claim 1, wherein said insulating layer has a plurality of openings, a plurality of said first electrodes are disposed in said openings, said first electrodes having respective upper surfaces held in contact with said ion conduction layer and respective lower surfaces connected to different lower interconnections, wherein a voltage is applied to either one of said lower interconnections to change a conduction state between said one of said lower interconnections and said second electrode to operate as a selector.

15. The switching device according to claim 3, wherein a composition incapable of supplying said metal ions into said ion conduction layer includes a metal which is either platinum, aluminum, gold, titanium, tungsten, vanadium, niobium, tantalum chromium, or molybdenum, a nitride of at least either one of the metals, a silicide of at least either one of the metals, or a combination of plural ones of the metals.

16. The switching device according to claim 1, wherein said ion conduction layer includes a sulfide or an oxide which contains at least one of copper, tungsten, tantalum, molybdenum, chromium, titanium, and cobalt, or an oxysulfide having an arbitrary sulfur-oxygen ratio.

17. The switching device according to claim 2, wherein a composition capable of supplying said metal ions into said ion conduction layer includes a metal or an alloy containing a primary material of at least one of Cu, Ag, and Pb.

18. The switching device according to claim 1, wherein said material for preventing said metal ions from being diffused comprises a silicon nitride film, a silicon oxynitride film, or either one of these films which contain copper.

19. The switching device according to claim 1, wherein said first insulating layer comprises a silicon nitride film formed by a plasma CVD process using ammonia as a source of nitrogen.

20. A semiconductor device comprising:
a plurality of switching devices according to claim 1, disposed on a base body;
wherein in at least two of said switching devices, said first electrode and said second electrode are spaced a predetermined distance from each other on said ion conduction layer which is undivided and continuous.

21. A semiconductor device comprising:
a switching device according to claim 1, disposed in a multilayer interconnection structure disposed on a semiconductor substrate.

22. A memory device comprising a memory cell as a basic unit, said memory cell including a switching device according to claim 1 and a transistor or a diode.

23. A programmable logic integrated circuit including a programming switch comprising a switching device according to claim 1.

* * * * *